(12) United States Patent
Hansen et al.

(10) Patent No.: US 11,664,674 B2
(45) Date of Patent: *May 30, 2023

(54) SYSTEMS AND METHODS FOR IMPROVED BATTERY ENERGY STORAGE SYSTEM THERMAL MANAGEMENT

(71) Applicant: 8ME NOVA, LLC, El Dorado Hills, CA (US)

(72) Inventors: Lukas Mercer Hansen, El Dorado Hills, CA (US); Kamran Moradi, Sterling, VA (US); Nadim Kanan, Elk Grove, CA (US); Finbar Sheehy, San Francisco, CA (US)

(73) Assignee: 8ME NOVA, LLC, El Dorado Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/080,965

(22) Filed: Dec. 14, 2022

(65) Prior Publication Data
US 2023/0115535 A1 Apr. 13, 2023

Related U.S. Application Data

(63) Continuation of application No. 17/717,983, filed on Apr. 11, 2022, now Pat. No. 11,545,848.
(Continued)

(51) Int. Cl.
*G05D 16/20* (2006.01)
*B05B 7/04* (2006.01)
(Continued)

(52) U.S. Cl.
CPC ...... *H02J 7/007194* (2020.01); *G01R 31/367* (2019.01); *G01R 31/3648* (2013.01);
(Continued)

(58) Field of Classification Search
CPC ..................................................... H01M 10/60
(Continued)

(56) References Cited

U.S. PATENT DOCUMENTS 10,128,544 B2 * 11/2018 Cutright .............. H01M 10/663
2010/0127664 A1 5/2010 Paice et al.
(Continued)

OTHER PUBLICATIONS

Kong, et al. "A novel battery thermal management system coupling with PCM and optimized controllable liquid cooling for different ambient temperatures," Energy Conversion and Management 204 (2020) 112280, Elsevier Publication, Jul. 2019.

*Primary Examiner* — Md Azad
(74) *Attorney, Agent, or Firm* — Foley & Lardner LLP

(57) ABSTRACT

The present disclosure provides systems and methods for managing a temperature of a battery energy storage system ("BESS"). A method may comprise identifying operating temperature limitations of the BESS; obtaining a forecast horizon comprising a forecast of external environmental conditions for a time period; identifying a charging/discharging schedule of the BESS; simulating operation of the BESS for the time period for each of a plurality of sequences of thermal management modes according to the charging/discharging schedule and the forecast horizon, the simulating generating an energy consumption and an operating temperature forecast of for each of the plurality of sequences of thermal management modes; selecting a sequence of thermal management modes of the plurality of sequences; and operating the equipment according to the selected sequence of thermal management modes.

20 Claims, 10 Drawing Sheets

Related U.S. Application Data

(60) Provisional application No. 63/230,702, filed on Aug. 7, 2021.

(51) Int. Cl.

| | | |
|---|---|---|
| *B05B 7/16* | (2006.01) | |
| *G05D 23/19* | (2006.01) | |
| *B05B 12/00* | (2018.01) | |
| *G05B 15/02* | (2006.01) | |
| *H04Q 9/00* | (2006.01) | |
| *G01K 1/024* | (2021.01) | |
| *G01K 1/02* | (2021.01) | |
| *G01K 13/02* | (2021.01) | |
| *G01L 15/00* | (2006.01) | |
| *G01L 19/00* | (2006.01) | |
| *G01L 19/08* | (2006.01) | |
| *H02J 7/00* | (2006.01) | |
| *G01R 31/36* | (2020.01) | |
| *G01R 31/367* | (2019.01) | |
| *H01M 10/60* | (2014.01) | |
| *H05K 7/20* | (2006.01) | |

(52) U.S. Cl.
CPC ............ *H01M 10/60* (2015.04); *H02J 7/0071* (2020.01); *H02J 7/00309* (2020.01); *H05K 7/20209* (2013.01)

(58) Field of Classification Search
USPC ........................................................ 700/300
See application file for complete search history.

(56) References Cited

U.S. PATENT DOCUMENTS

| | | |
|---|---|---|
| 2012/0029724 A1 | 2/2012 | Formanski et al. |
| 2013/0013121 A1* | 1/2013 | Henze ................... G06Q 10/04 700/291 |
| 2014/0285135 A1 | 9/2014 | Ji et al. |
| 2016/0268804 A1 | 9/2016 | Shim |
| 2019/0207406 A1 | 7/2019 | Matthey et al. |
| 2019/0369166 A1 | 12/2019 | Moslemi et al. |
| 2020/0338959 A1 | 10/2020 | Carlson et al. |
| 2022/0271363 A1* | 8/2022 | Burkell ................... B60L 58/27 |

* cited by examiner

Conventional Thermal Management
Scenario: Charging completed, no charge or discharge expected for at least 3 hours, require temperature returned to 23 Celsius within 3 hours

| | T | T+20 | T+40 | T+1hr | T+1:20 | T+1:40 | T+2hr | T+2:20 | T+2:40 | T+3h |
|---|---|---|---|---|---|---|---|---|---|---|
| ΔT/20min | -4 | -4 | -4 | -0.5 | -0.5 | -0.4 | -0.4 | -0.4 | 2 | 2 |
| Tcell (start) | 34.0 | 30.0 | 26.0 | 22.0 | 21.5 | 21.1 | 20.6 | 20.2 | 19.9 | 21.9 |
| Tcell (end) | 30.0 | 26.0 | 22.0 | 21.5 | 21.1 | 20.6 | 20.2 | 19.9 | 21.9 | 23.9 |
| OAT | 15 | 15 | 15 | 15 | 15 | 15 | 15 | 15 | 15 | 15 |
| Start time (min) | 0 | 20 | 40 | 60 | 80 | 100 | 120 | 140 | 160 | 180 |
| Compressor 1 On | X | X | X | | | | | | | |
| Compressor 2 On | X | X | X | | | | | | | |
| Heater | | | | | | | | | X | X |
| Fans On | X | X | X | | | | | | | |
| Active Thermal Mgt OFF | | | | X | X | X | X | X | X | X |

Advanced Thermal Management
Scenario: Charging completed, no charge or discharge expected for at least 3 hours, require temperature returned to 23 Celsius within 3 hours

| | T | T+20 | T+40 | T+1hr | T+1:20 | T+1:40 | T+2hr | T+2:20 | T+2:40 | T+3h |
|---|---|---|---|---|---|---|---|---|---|---|
| ΔT/20min | -2.0 | -2.0 | -1.0 | -1.0 | -1.0 | -1.0 | -1.0 | -0.7 | -0.7 | -0.6 |
| Tcell (start) | 34.0 | 32.0 | 30.0 | 29.0 | 28.0 | 27.0 | 26.0 | 25.0 | 24.3 | 23.7 |
| Tcell (end) | 32.0 | 30.0 | 29.0 | 28.0 | 27.0 | 26.0 | 25.0 | 24.3 | 23.7 | 23.1 |
| OAT | 15 | 15 | 15 | 15 | 15 | 15 | 15 | 15 | 15 | 15 |
| Start time (min) | 0 | 20 | 40 | 60 | 80 | 100 | 120 | 140 | 160 | 180 |
| Compressor 1 On | X | X | | | | | | | | |
| Compressor 2 On | | | | | | | | | | |
| Heater | | | | | | | | | | |
| Fans On | X | X | X | X | X | X | X | | | |
| Active Thermal Mgt OFF | | | | | | | | X | X | X |

FIG. 7A

| | Power | 3hr Scenario - Traditional Run | | 3hr Scenario new Algorithm Run | |
|---|---|---|---|---|---|
| | kW | 20-min slots | kWh | 20-min slots | kWh |
| Fan | 2.00 | 3.00 | 2.00 | 7.00 | 4.67 |
| Compressor 1 | 7.00 | 3.00 | 7.00 | 2.00 | 4.67 |
| Compressor 2 | 7.00 | 3.00 | 7.00 | 0.00 | 0.00 |
| Heater | 5.00 | 2.00 | 3.33 | 0.00 | 0.00 |
| Total Aux consumption (kWh) | | | 19.33 | | 9.33 |

FIG. 7B

Conventional Thermal Management
Scenario: Charging completed, no charge or discharge expected for at least 3 hours, require temperature returned to 23 Celsius within 3 hours

| | T | T+20 | T+40 | T+1hr | T+1:20 | T+1:40 | T+2hr | T+2:20 | T+2:40 | T+3h |
|---|---|---|---|---|---|---|---|---|---|---|
| ΔT/20min | -4 | -4 | -4 | 0 | 0 | 0 | 0 | 0 | 0 | 0 |
| Tcell (start) | 34 | 30 | 26 | 22 | 22 | 22 | 22 | 22 | 22 | 22 |
| Tcell (end) | 30 | 26 | 22 | 22 | 22 | 22 | 22 | 22 | 22 | 22 |
| OAT | 15 | 15 | 15 | 15 | 15 | 15 | 15 | 15 | 15 | 15 |
| Start time (min) | 0 | 20 | 40 | 60 | 80 | 100 | 120 | 140 | 160 | 180 |
| Compressor 1 On | X | X | X | | | | | | | |
| Compressor 2 On | X | X | X | | | | | | | |
| Heater | | | | | | | | | | |
| Fans On | X | X | X | | | | | | | |
| Active Thermal Mgt OFF | | | | X | X | X | X | X | X | X |

Advanced Thermal Management
Scenario: Charging completed, no charge or discharge expected for at least 3 hours, require temperature returned to 23 Celsius within 3 hours

| | T | T+20 | T+40 | T+1hr | T+1:20 | T+1:40 | T+2hr | T+2:20 | T+2:40 | T+3h |
|---|---|---|---|---|---|---|---|---|---|---|
| ΔT/20min | -2 | -2 | -2 | -1 | -1 | -1 | -1 | -1 | -1 | 0 |
| Tcell (start) | 34 | 32 | 30 | 28 | 27 | 26 | 25 | 24 | 23 | 22 |
| Tcell (end) | 32 | 30 | 28 | 27 | 26 | 25 | 24 | 23 | 22 | 22 |
| OAT | 15 | 15 | 15 | 15 | 15 | 15 | 15 | 15 | 15 | 15 |
| Start time (min) | 0 | 20 | 40 | 60 | 80 | 100 | 120 | 140 | 160 | 180 |
| Compressor 1 On | X | X | X | | | | | | | |
| Compressor 2 On | | | | | | | | | | |
| Heater | | | | | | | | | | |
| Fans On | X | X | X | X | X | X | X | X | | |
| Active Thermal Mgt OFF | | | | | | | | | X | X |

FIG. 8A

| | Power | 1 hr Scenario - Traditional Run | | 1 hr Scenario new Algorithm Run | |
|---|---|---|---|---|---|
| | kW | 20-min slots | kWh | 20-min slots | kWh |
| Fan | 2.00 | 4.00 | 2.67 | 4.00 | 2.67 |
| Compressor 1 | 7.00 | 3.00 | 7.00 | 3.00 | 7.00 |
| Compressor 2 | 7.00 | 3.00 | 7.00 | 2.00 | 4.67 |
| Heater | 5.00 | 0.00 | 0.00 | 0.00 | 0.00 |
| Total Aux consumption (kWh) | | | 16.67 | | 14.33 |

FIG. 8B

SYSTEMS AND METHODS FOR IMPROVED BATTERY ENERGY STORAGE SYSTEM THERMAL MANAGEMENT

CROSS-REFERENCE TO RELATED APPLICATIONS

This application claims the benefit of priority as a continuation to U.S. patent application Ser. No. 17/717,983, filed Apr. 11, 2022, which claims the benefit of priority to U.S. Provisional Application No. 63/230,702, filed Aug. 7, 2021, the entirety of each of which is incorporated by reference herein.

BACKGROUND

Several industrial applications may implement the use of a battery energy storage system ("BESS") for the use of storing, and later providing, electrical energy. A BESS may have a limited operating temperature range in order to protect the expected useful life of the battery cells and prevent battery fires.

During charging and discharging, battery cell temperatures tend to rise as a result of the resistive losses and can generate substantial amounts of heat. Thermal management systems operate to prevent the cell temperature from rising to any level that can impact the batteries negatively. Even when the battery is neither being charged nor discharged, it may be optimal to use thermal management systems to control the battery temperature, if the environmental temperature is above or below the target range for the battery temperature. Thermal management systems may require a large amount of energy, and therefore a large amount of money, to run in maintaining a BESS within operating temperature limitations.

SUMMARY

The present disclosure provides systems and methods for managing a temperature of a battery energy storage system ("BESS"). In some embodiments of the present disclosure, the method comprises identifying operating temperature limitations for a BESS. The operating temperature limitations may include a maximum operating temperature and a minimum operating temperature. The operating temperature limitations may also include an upper normal operating temperature being lower than the maximum operating temperature, and a lower normal operating temperature being higher than the minimum operating temperature. The operating temperature limitations may also include threshold temperatures for the BESS to reach at a specified time. The method may include identifying a plurality of thermal management modes for managing the temperature of the BESS. The thermal management modes may include both cooling and heating modes. There may be several cooling modes and several heating modes, each with their own energy consumption rate. The method may include obtaining a forecast of external environmental conditions for a plurality of time periods. The forecast of external environmental conditions can include, for example, information about outside air temperature, humidity, cloud coverage, wind conditions, rain conditions, snow conditions, etc. The time periods can be of varying lengths and define an overall forecast horizon. The time periods in a forecast horizon can be of equal time intervals, or of varying time intervals. The method may include determining an operating profile of the BESS during the plurality of time periods. The operating profile may include a charging/discharging schedule of the BESS over the plurality of time periods. The method may include processing (i) the one or more thermal management modes for managing the temperature of the BESS, (ii) the forecast of external environmental conditions, and (iii) the operating profile with a thermal model of the BESS to generate a temperature profile of the BESS for each of the plurality of time periods. The method may optionally include, for each of the plurality of time periods, identifying thermal management modes of the plurality of thermal management modes that maintain the BESS within the operating temperature limitations, and identifying thermal management modes of the plurality of thermal management modes that fail to maintain the BESS within the operating temperature limitations. This step may allow the system to identify all possible sequences of thermal management modes across the plurality of time periods in a forecast horizon. The method may include for each of the plurality of time periods and based at least in part on the temperature profile, selecting a thermal management mode of the plurality of thermal management modes that minimizes an energy consumption rate while maintaining the BESS within the operating temperature limitations.

The method above provides several improvements to the technical field of BESS thermal management. The method uses a forecast of BESS operation as well as a forecast of external environmental factors to help determine the temperature profile of a BESS, allowing the thermal management system to predict temperature changes in the BESS before they occur. The method also takes into consideration the energy consumption rate of each of the available thermal management modes and selects the most energy efficient sequence of thermal management modes across a plurality of time periods for maintaining the BESS within its operating temperature limitations. Thus, the method can proactively prepare for temperature changes in the BESS and manage the temperature of the BESS in the most energy efficient manner.

In an aspect, the present disclosure describes a method for managing a temperature of a battery energy storage system ("BESS"). The method may comprise identifying, by a processor, operating temperature limitations of the BESS; obtaining, by the processor, a forecast horizon comprising a forecast of external environmental conditions for a time period; identifying, by the processor, a charging/discharging schedule of the BESS for the time period; simulating, by the processor, operation of the BESS for the time period for each of a plurality of sequences of thermal management modes according to the charging/discharging schedule of the BESS and the forecast horizon, the simulating generating an energy consumption and an operating temperature forecast of the BESS across the time period for each of the plurality of sequences of thermal management modes; selecting, by the processor, a sequence of thermal management modes of the plurality of sequences responsive to the sequence minimizing an energy consumption of equipment that affects a temperature of the BESS across the time period while causing the BESS to remain within the operating temperature limitations; and operating, by the processor, the equipment according to the selected sequence of thermal management modes.

In some embodiments, simulating operation of the BESS for the time period for each of the plurality of sequences comprises removing, by the processor, a subset of sequences from the plurality of sequences responsive to the simulation indicating each sequence of the subset will result in the BESS having an operating temperature that exceeds a maximum temperature limitation or a minimum temperature limitation for at least one point in time of the time period.

In some embodiments, the method further comprises, except for the subset of sequences, comparing, by the processor, the generated energy consumption across the time period for the plurality of sequences between each other. In some embodiments, method comprises identifying, by the processor, a plurality of thermal management modes from memory, and combining, by the processor, different subsets of the plurality of thermal management modes into the plurality of sequences of thermal management modes.

In some embodiments, a first sequence of the plurality of sequences of thermal management modes comprises an activation status of one or more compressors, a heater, and/or a fan for each of a plurality of time frames within the time period. In some embodiments, simulating operation of the BESS for the time period for the first sequence comprises calculating, by the processor, a first energy consumption of the one or more compressors, the heater, and/or the fan for the time period based on the activation status of the one or more compressors, the heater, and/or the fan for the plurality of time frames.

In some embodiments, the time period comprises a plurality of time frames, and wherein simulating operation of the BESS for the time period for each of the plurality of sequences of thermal management modes comprises identifying, by the processor, a first operating temperature of the BESS under a first sequence of thermal management modes within a first time frame of the plurality of time frames; determining, by the processor, the first operating temperature of the BESS exceeds a maximum operating temperature limit or is less than a minimum operating temperature limit; and responsive to the determining, removing, by the processor, the first sequence of thermal management modes from the plurality of sequences of thermal management modes.

In some embodiments, simulating operation of the BESS for the time period for each of the plurality of sequences of thermal management modes comprises subsequent to removing the first sequence of thermal management modes from the plurality of sequences of thermal management modes, for a second time frame subsequent to the first time frame, comparing, by the processor, a second operating temperature of the BESS under each of the plurality of sequences except for the first sequence of thermal management modes to the maximum operating temperature limit or the minimum operating temperature limit. In some embodiments, identifying the first operating temperature for the BESS comprises identifying, by the processor, the first operating temperature of the BESS at an end of the first time frame.

In some embodiments, the method further comprises, upon identifying a subset of sequences of the plurality of sequences that do not violate any operating criteria of the BESS, comparing, by the processor, an energy consumption across the time period of each sequence of the subset, wherein selecting the sequence of thermal management modes comprises selecting, by the processor, the sequence of thermal management modes from the subset responsive to the selected sequence of thermal management modes having a lowest energy consumption of the subset.

In some embodiments, the method further comprises, during the time period: determining, by the processor, operation of the equipment under the selected sequence of thermal management modes will cause the operating temperature of the BESS to violate the operating temperature limitations; responsive to the determining, simulating, by the processor, operation of the BESS for a remainder of the time period for each of a second plurality of sequences of thermal management modes according to the charging/discharging schedule of the BESS and the forecast horizon; selecting, by the processor, a second sequence of thermal management modes of the second plurality of sequences responsive the second sequence minimizing an energy consumption of the equipment across the remainder of the time period while causing the BESS to remain within the operating temperature limitations; and operating, by the processor, equipment that affects a temperature of the BESS according to the selected second sequence of thermal management modes.

In another aspect, the present disclosure provides for a system for managing a temperature of a battery energy storage system ("BESS"), comprising one or more computer processors operatively coupled to computer memory and configured by machine-readable instructions to: identify operating temperature limitations of the BESS; obtain a forecast horizon comprising a forecast of external environmental conditions for a time period; identify a charging/discharging schedule of the BESS for the time period; simulate operation of the BESS for the time period for each of a plurality of sequences of thermal management modes according to the charging/discharging schedule of the BESS and the forecast horizon, the simulation generating an energy consumption and an operating temperature forecast of the BESS across the time period for each of the plurality of sequences of thermal management modes; select a sequence of thermal management modes of the plurality of sequences responsive to the sequence minimizing an energy consumption of equipment that affects a temperature of the BESS across the time period while causing the BESS to remain within the operating temperature limitations; and operate the equipment according to the selected sequence of thermal management modes.

In some embodiments, the one or more computer processors are configured by the machine-readable instructions to simulate operation of the BESS for the time period for each of the plurality of sequences by removing a subset of sequences from the plurality of sequences responsive to the simulation indicating each sequence of the subset will result in the BESS having an operating temperature that exceeds a maximum temperature limitation or a minimum temperature limitation for at least one point in time of the time period.

In some embodiments, the one or more computer processors are further configured by the machine-readable instructions to, except for the subset of sequences, compare the generated energy consumption across the time period for the plurality of sequences between each other. In some embodiments, the one or more computer processors are further configured by the machine-readable instructions to identify a plurality of thermal management modes from memory, and combine different subsets of the plurality of thermal management modes into the plurality of sequences of thermal management modes. In some embodiments, a first sequence of the plurality of sequences of thermal management modes comprises an activation status of one or more compressors, a heater, and/or a fan for each of a plurality of time frames within the time period. In some embodiments, the one or more computer processors are configured by the machine-readable instructions to simulate operation of the BESS for the time period for the first sequence by calculating a first energy consumption of the one or more compressors, the heater, and/or the fan for the time period based on the activation status of the one or more compressors, the heater, and/or the fan for the plurality of time frames.

In some embodiments, the time period comprises a plurality of time frames, and wherein the one or more computer processors are configured by the machine-readable instructions to simulate operation of the BESS for the time period for each of the plurality of sequences of thermal management modes by identifying a first operating temperature of the BESS under a first sequence of thermal management modes within a first time frame of the plurality of time frames; determining the first operating temperature of the BESS exceeds a maximum operating temperature limit or is less than a minimum operating temperature limit; and responsive to the determining, removing the first sequence of thermal management modes from the plurality of sequences of thermal management modes.

In some embodiments, the one or more computer processors are configured by the machine-readable instructions to simulate operation of the BESS for the time period for each of the plurality of sequences of thermal management modes by, subsequent to removing the first sequence of thermal management modes from the plurality of sequences of thermal management modes, for a second time frame subsequent to the first time frame, comparing a second operating temperature of the BESS under each of the plurality of sequences except for the first sequence of thermal management modes to the maximum operating temperature limit or the minimum operating temperature limit.

In another aspect, the present disclosure provides one or more non-transitory computer storage media storing instructions that are operable, when executed by one or more computers, to cause said one or more computers to perform operations comprising identifying operating temperature limitations of the BESS; obtaining a forecast horizon comprising a forecast of external environmental conditions for a time period; identifying a charging/discharging schedule of the BESS for the time period; simulating operation of the BESS for the time period for each of a plurality of sequences of thermal management modes according to the charging/discharging schedule of the BESS and the forecast horizon, the simulating generating an energy consumption and an operating temperature forecast of the BESS across the time period for each of the plurality of sequences of thermal management modes; selecting a sequence of thermal management modes of the plurality of sequences responsive to the sequence minimizing an energy consumption of equipment that affects a temperature of the BESS across the time period while causing the BESS to remain within the operating temperature limitations; and operating the equipment according to the selected sequence of thermal management modes.

In an aspect, the present disclosure provides a method for managing a temperature of a battery energy storage system ("BESS"). The method can comprise: identifying operating temperature limitations of the BESS; identifying a plurality of thermal management modes, and constructing one or more potential sequences of thermal management modes for managing the temperature of the BESS; obtaining a forecast of external environmental conditions for a plurality of time periods, wherein the plurality of time periods, together, define a forecast horizon; determining an operating profile of the BESS during the plurality of time periods; processing (i) the one or more potential sequences of thermal management modes, (ii) the forecast of external environmental conditions, and (iii) the operating profile with a thermal model of the BESS to generate a temperature profile of the BESS for each of the one or more potential sequences, for each of the plurality of time periods; and for the forecast horizon, and based at least in part on the temperature profile, selecting a sequence of thermal management modes of the plurality of thermal management modes that minimizes an energy consumption rate across the forecast horizon while maintaining the BESS within the operating temperature limitations.

In some embodiments, the external environmental conditions may comprise air temperature. The operating profile of the BESS may comprise a charging/discharging schedule. The operating temperature limitations may comprise a maximum operating temperature and a minimum operating temperature. The operating temperature limitations may further comprise an upper normal operating temperature and a lower normal operating temperature. In some instances, the upper normal operating temperature may be lower than the maximum operating temperature, and the lower normal operating temperature may be greater than the minimum operating temperature. The operating temperature limitations may comprise a threshold temperature to be reached at a specified time. The thermal model may comprise a model of temperature rise when heat is added to the BESS, and a model of temperature decline when heat is removed from the BESS. The thermal model may further comprise a model of heat transfer from the BESS to an external environment, and from the external environment to the BESS. The thermal model may further comprise, for each of the one or more thermal management modes, a model of heat removal from the BESS or a model of heat addition to the BESS.

In some embodiments of the method, selecting thermal management modes in step f) may be subject to limitations. The limitations may comprise: requiring a thermal management mode to be run for a set period of time and limiting which thermal management modes may be run (i) in sequence or (ii) concurrently. In some embodiments, the method may further comprise, prior to f), for each of the plurality of time periods, identifying thermal managements modes of the plurality of thermal management modes that maintain the BESS within the operating temperature limitations, and identifying thermal management modes of the plurality of thermal management modes that fail to maintain the BESS within the operating temperature limitations.

Another aspect of the present disclosure provides a non-transitory computer readable medium comprising machine executable code that, upon execution by one or more computer processors, implements any of the methods above or elsewhere herein.

Another aspect of the present disclosure provides a system comprising one or more computer processors and computer memory coupled thereto. The computer memory comprises machine executable code that, upon execution by the one or more computer processors, implements any of the methods above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIGS. 7A and 7B are tables illustrating multiple thermal management modes for managing the temperature of a BESS, according to some embodiments;

FIGS. 8A and 8B are tables illustrating multiple thermal management modes for managing the temperature of a BESS, according to some embodiments;

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

BESS Thermal Management

Figure 1:
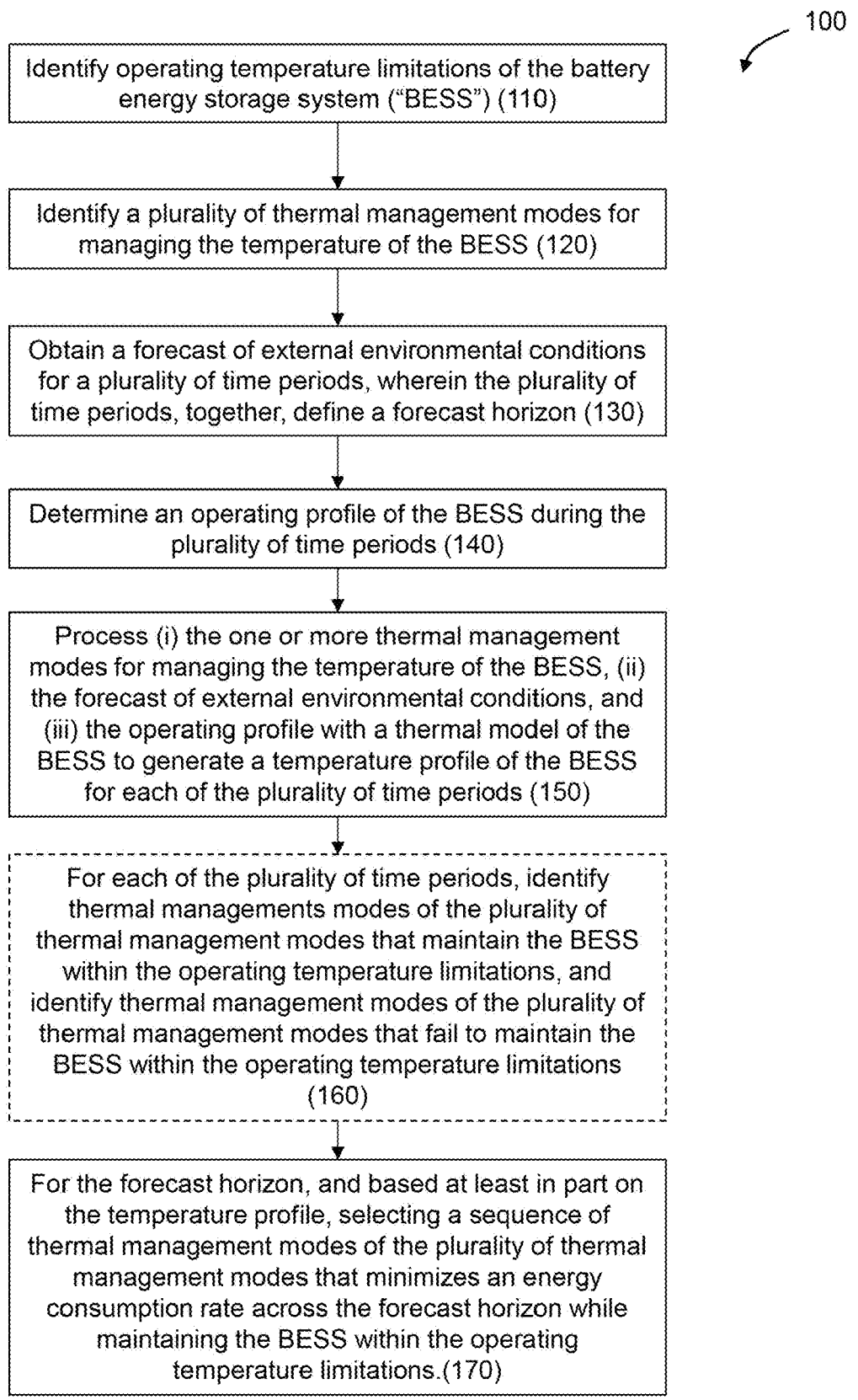
FIG. 1 is a flow chart of a process for managing a temperature of a battery energy storage system ("BESS"), according to some embodiments.

FIG. 1 is a flow chart of a process 100 for managing the temperature of a battery energy storage system ("BESS"). The BESS may be of any size and contain any number of batteries. For example, the BESS may be a utility-scale BESS. The process can be performed by a system of one or more appropriately programmed computers in one or more locations. For example, the process can be performed by the computer systems described below in FIG. 4.

The system can identify operating temperature limitations of the BESS (110). The operating temperature limitations can set forth a temperature range that the BESS is to be maintained within. For example, the operating temperature limitations can include a maximum operating temperature. The maximum operating temperature can be a maximum temperature that the BESS can operate at before damage to the batteries occurs. The maximum operating temperature can define an upper temperature that the BESS is to stay below. The operating temperature limitations can also include a minimum operating temperature. The minimum operating temperature can be a minimum temperature that the BESS can operate at before damage to the batteries occurs. The minimum operating temperature can define a lower temperature that the BESS is to stay above. The range between the maximum operating temperature and the minimum operating temperature can define an allowable temperature range for the BESS.

The operating temperature limitations can also include an upper normal operating temperature. The upper normal operating temperature can be a temperature less than the maximum operating temperature. The upper normal operating temperature can be a target temperature for the BESS to reach before a certain time. The upper normal operating temperature can also be an upper temperature to keep the BESS below while operating. The operating temperature limitations can also include a lower normal operating temperature. The lower normal operating temperature can be a target temperature for the BESS to reach before a certain time. The lower normal operating temperature can also be a lower temperature to keep the BESS above while operating. The range between the upper normal operating temperature and the lower normal operating temperature can define an allowable temperature range for the BESS.

The operating temperature limitations can also include a threshold temperature. The threshold temperature can be a maximum or minimum temperature for the BESS to reach by a specified time.

The system can identify a plurality of thermal management modes for managing the temperature of the BESS (120). Thermal management modes may include heating the BESS to stay above a lower operating temperature limit. Thermal management modes may also include cooling the BESS to stay below an upper operating temperature limit. The thermal management modes may comprise any thermal management system used to maintain the temperature of the BESS. For example, thermal management modes may include the use of heating equipment, such as a space heater or a heat pump, configured to heat the BESS. Thermal management modes may also include the use of cooling equipment, such as fans, air conditioners, or liquid cooling systems, configured to cool the BESS.

The thermal management modes can include multiple modes of operating cooling and/or heating equipment. For example, the thermal management modes may run some, but not all of the compressors in an air conditioning system, resulting in reduced cooling capacity and power consumption. This may be an example of a lower power cooling mode, which may be beneficial if the temperature of the BESS is rising slowly; for example, when the BESS is being charged or discharged at a minimal rate. As another example, the thermal management modes may also operate heating and/or cooling equipment in one area of a BESS, and not others, depending on localized temperature measurements of the BESS.

The system herein can also be configured to construct one or more potential sequences of thermal management modes for managing the temperature of the BESS. Each of the one or more potential sequences can comprise a particular order in which one or more management modes are implemented/executed. The thermal management modes from which the potential sequences are constructed can be selected from the plurality of thermal management modes that have been identified. It is contemplated that multiple different potential sequences can be constructed, in any order, combination or permutation.

Figure 2:
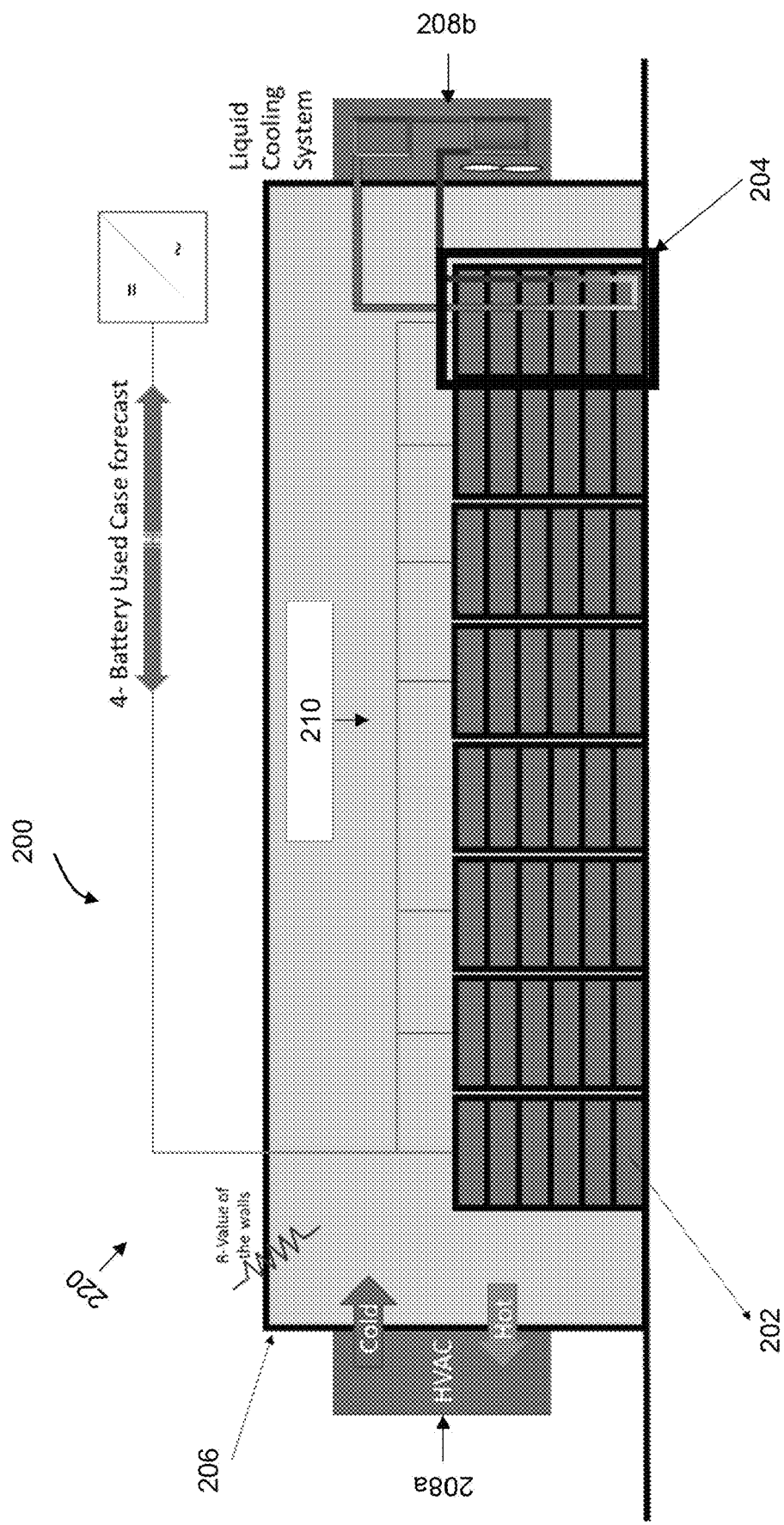
FIG. 2 illustrates multiple thermal management modes for managing the temperature of a BESS, according to some embodiments.

FIG. 2 illustrates multiple thermal management modes for managing the temperature of a BESS 200. The BESS 200 of FIG. 2 comprises battery cells 202, a battery enclosure 206, cooling systems 208a and 208b, internal ambient air 210, and an external environment 220. Using cooling system 208a, heat is transferred between the battery cells 202 and the internal ambient air 210 inside the battery enclosure 206, and then between the internal ambient air 210 and the external environment 220 through the heating, ventilation and air conditioning ("HVAC") system. Cooling system 208a may include several mechanisms for heat transfer, including passive vanes and fans associated with battery modules or racks, as well as enclosure-level fans and active air conditioning systems which may be operated with some or all of their compressor units operating.

Using cooling system 208b, heat may be transferred between the battery cells 202 and a liquid coolant, and then between the liquid coolant and the external environment 220. Liquid cooling systems such as 208b may also be operated with some or all of their compressor units operating and may circulate the liquid using higher or lower flow rates. The area 204 shown in FIG. 2 illustrates a localized battery cell location within the BESS 200 where localized cooling can occur, as described above.

The system can obtain a forecast of external environmental conditions for a plurality of time periods (130). The forecast of external environmental conditions can include, for example, information about outside air temperature, humidity, cloud coverage, wind conditions, rain conditions, snow conditions, etc.

The time periods, together, may define a forecast horizon of the BESS. The time periods may comprise time periods of varying length. For example, the time periods can be about 1, 2, 3, 4, 5, 6, 7, 8, 9, 10, 15, 20, 25, 30, 35, 40, 45, 50, 55, or 60 minutes or more. In addition, the time periods can be about 1, 2, 3, 4, 5, 6, 7, 8, 9, 10, 11, 12, 13, 14, 15, 16, 17, 18, 19, 20, 21, 22, 23, or 24 hours or more. In addition, the time periods can be about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 days or more. Each of the time periods in a forecast horizon may be equal in length, or they may have differing durations.

The system can determine an operating profile of the BESS during the plurality of time periods (140). The operating profile of the BESS can include, for example, a charging and/or discharging schedule of the BESS over the plurality of time periods.

The operating profile of the BESS may also include a thermal model of the BESS. The thermal model may include a plurality of models modeling the rate of heat addition and heat loss to and from the BESS under several operating conditions. For example, the thermal model may include a model of temperature rise when heat is added to the BESS, and a model of temperature decline when heat is removed from the BESS. These models may account for temperature rise and temperature decline of the BESS at several charging/discharging levels (e.g., the temperature of the BESS may increase or decrease as the BESS charges or discharges). The models may be related to the thermal mass of the BESS.

The thermal model may include a model of heat transfer from the BESS to an external environment, and from the external environment to the BESS. These thermal models may account for the heat transfer through the available heat transfer mechanisms (e.g., increase or decrease a projected temperature or heat transfer to or from the BESS), including any of the heat transfer mechanisms described herein, such as internal ambient air, liquid coolants, and the heat transfer through any walls of an enclosure surrounding the BESS. For example, the model of heat transfer from the BESS to an external environment causes heat to be transferred from the BESS to the external environment when the temperature of the BESS is greater than the temperature of the external environment. In another example, the model of heat transfer from the external environment to the BESS accounts for when the temperature of the external environment is greater than the temperature of the BESS. In another example, the model of heat transfer may account for the BESS charging or discharging by increasing the projected temperature of the BESS for the time period in which the BESS is charging or discharging. The thermal model may increase or decrease the projected temperature of the BESS based on any factors.

The thermal model may include, for each of the one or more thermal management modes, a model of heat removal from the BESS or a model of heat addition to the BESS. For example, the model of heat removal from the BESS may account for the heat removal that each of the cooling systems can provide the BESS. If the cooling system is an air conditioning system, the model of heat removal may account for the amount of heat the air conditioning system can remove from the BESS over time. The model of heat removal may account for the amount of heat the air conditioning system can remove from the BESS in a plurality of operating modes. For example, the operating modes can include a high-power mode, where the entire air conditioning system is being run, or lower power modes, as described above, where only some of the compressors of the air conditioning system are being run. The model of heat removal can also account for the amount of heat a liquid cooling system can remove from the BESS over time and at a plurality of operating modes. The model of heat addition to the BESS can account for how much heat a heating system, such as a space heater or a heat pump, can add to the BESS over time and at a plurality of operating modes. The model of heat addition to the BESS can account for how much heat is produced by charging or discharging the BESS. The model of heat addition and heat removal may account for the respective temperatures of the BESS and the external environment, among other factors such as the external humidity and the temperatures of coolant fluids inside the battery enclosure.

The thermal model may also include an energy consumption rate of each of the plurality of thermal management modes. For example, the thermal model may include an energy consumption rate for an air conditioning system operating at the plurality of operating modes mentioned above. The thermal model may include an energy consumption for the air conditioning system operating in a high-power mode, where the entire air conditioning system is being run, or lower power modes, as described above, where only some of the compressors of the air conditioning system are being run. The thermal model may include similar models for other cooling systems, such as liquid cooling systems, and for heating systems as well, such as space heaters or heat pumps.

The thermal model of the BESS may also account for any limitations on the sequence of thermal management modes over the plurality of time periods. For example, limitations may include requiring a thermal management mode to be run for a set period of time and limiting which thermal management modes may be run in sequence. For example, the limitations may prohibit a heating mode from operating directly after a cooling mode. For example, the limitations may require that a "fans only" mode be run in between a cooling and heating mode where the compressors of the heating and/or cooling mode are not run. Or the limitations may require that a set period of time passes before a heating mode may follow a cooling mode. The limitations may also include a requirement that certain combinations of modes may not be run at all, or that a particular mode may be allowed to follow another mode only if the other mode has run for a set period of time. The limitations may also include a rule prohibiting certain modes from running at the same time. For example, the limitations may prohibit a heating mode from operating at the same time as a cooling mode. Additionally, the limitations may also provide limits or requirements on components of the heating and/or cooling systems when running. For example, a heating and/or cooling system may include a number of compressors as well as a number of fans. The limitations may require that, when the compressors of a heating and/or cooling system are running, that at least a certain number of fans are to operate at the same time.

The system can process (i) the one or more thermal management modes for managing the temperature of the BESS, (ii) the forecast of external environmental conditions, and (iii) the operating profile with the thermal model of the BESS to generate a temperature profile of the BESS for each of the plurality of time periods (150). If the system processes more than one thermal management mode, then more than one temperature profile of the BESS will exist for each of the plurality of time periods. Each of the temperature profiles of the BESS in a time period may depend on each of the temperature profiles of the BESS in the preceding time period.

The system can optionally, for each of the plurality of time periods, identify thermal management modes of the plurality of thermal management modes that maintain the BESS within the operating temperature limitations, and identify thermal management modes of the plurality of thermal management modes that fail to maintain the BESS within the operating temperature limitations (160). As mentioned above, the system can include a plurality of time periods and a plurality of thermal management modes. The number of time periods can be represented by the letter T. The number of thermal management modes may be represented by the letter N. For a first time period, there will be N number of thermal management modes to select from. Thus, there are N number of sequences to choose from. For a second time period, there will be $N^2$ number of sequences to choose from. $N^2$ comes from the N number of thermal management modes included in the first time period, each of which can be followed by N number of thermal management modes in the second time period. Further, for a third time period, there will be $N^3$ number of possible sequences using the same logic. In a system with T number of time periods in a forecast horizon, there will be $N^T$ number of possible sequences of thermal management modes through the forecast horizon.

The system can, at operation (160), model the trajectory of the temperature profile of the battery cells in the BESS through each possible sequence, determining the battery cell temperatures in the BESS at the end of each time period. The system can determine whether the thermal management mode for each time period in each sequence complies with any limitations on the allowable sequence of thermal management modes, as described above. For example, if the thermal management mode at any time period in a sequence does not comply with the limitations on the allowable sequence of thermal management modes, then that sequence can be removed from the list of possible sequences for sequence selection, as described at operation (170). Alternatively, if the thermal management mode does comply with the limitations on the allowable sequence of thermal management modes, then that sequence can remain in the list of possible sequences for sequence selection, as described at operation (170). If the thermal management mode does comply with the limitations on the allowable sequence of thermal management modes, then the system can determine the battery cell temperatures in the BESS at the end of each time period and determine whether that temperature complies with the operating temperature limitations established for the BESS. If the temperature at the end of the time period does not comply with the operating temperature limitations, then that sequence can also be removed from the list of possible sequences to select from at operation (170). The system can continue forward to the next time period in each of the remaining possible sequences, until it has modeled the Tth (final) time period.

Identifying, for each of the plurality of time periods, thermal managements modes of the plurality of thermal management modes that maintain the BESS within the operating temperature limitations, and identifying thermal management modes of the plurality of thermal management modes that fail to maintain the BESS within the operating temperature limitations, allows the system to remove entire sequences that are not possible, improving the selection process described below at operation (170). If all sequences are removed due to the operating temperature limitations and the limitations on the allowable sequence of thermal management modes, then the available thermal management modes are not capable of complying with the operating temperature and sequence limitations. If the system finds at least one possible sequence, then the system calculates the total energy consumption rate for the identified sequences. As described below at operation (170), the system may then select a sequence of thermal management modes that comprises the lowest energy consumption rate while maintaining the BESS within any operating temperature and sequence limitations.

Figure 3:
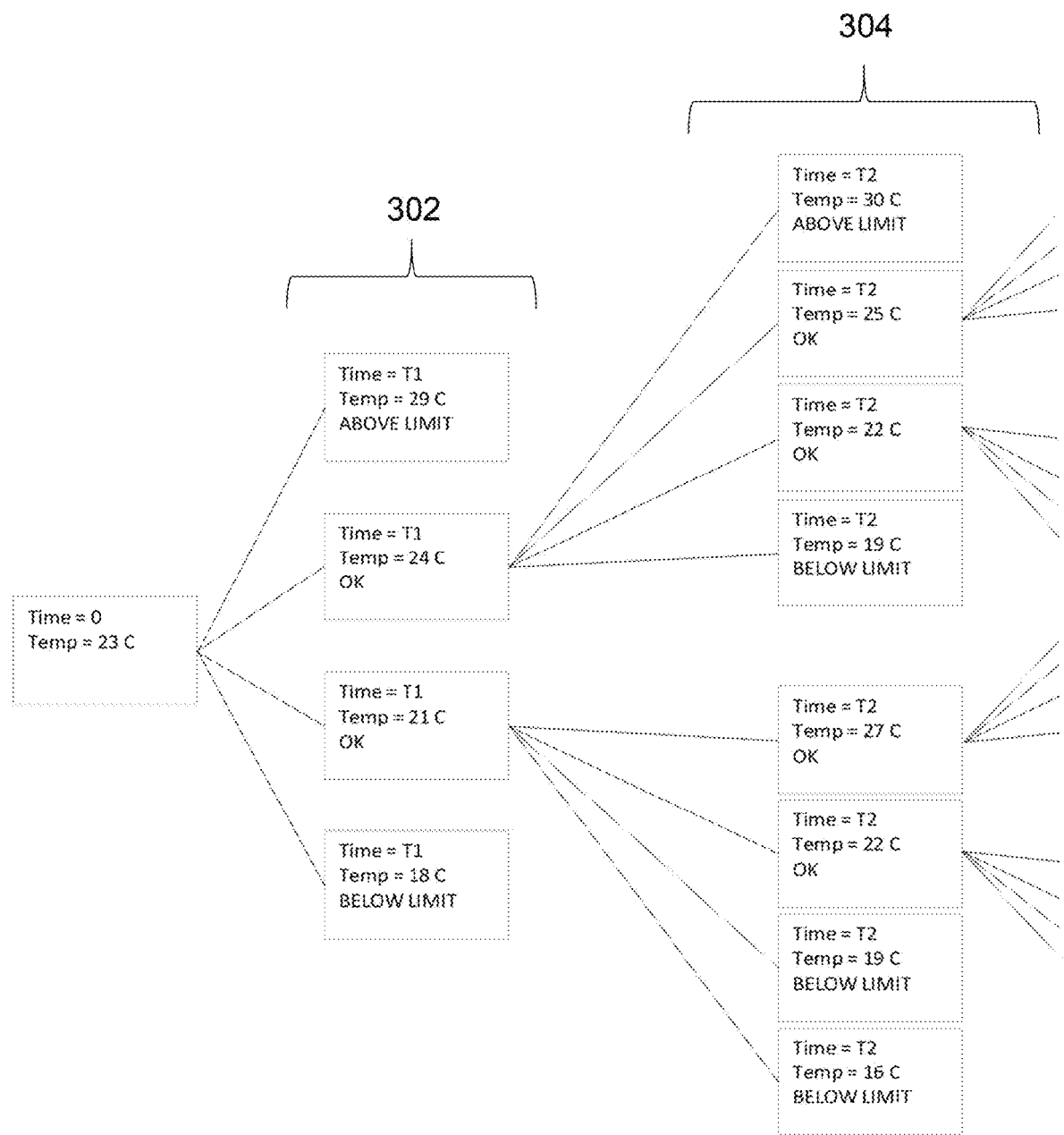
FIG. 3 illustrates a process for identifying a sequence of thermal management modes at a plurality of time periods, according to some embodiments.

FIG. 3 illustrates an example of identifying a sequence of thermal management modes at a plurality of time periods, in accordance with operation (160) described above. As illustrated in FIG. 3, the possible sequences through a first time period 302 and a second time period 304 are shown for a system including four different thermal management modes. The BESS has a maximum operating temperature and a minimum operating temperature, defining and allowable temperature range. The four different thermal management modes include, a high-power cooling mode, a medium-power cooling mode, a low-power cooling mode, and a mode with no active cooling taking place. The system calculates the temperature of the BESS at the end of the first time period 302 using each thermal management mode, and determines which thermal management modes meet the operating temperature limitations. As shown, the thermal management mode with no active cooling leads to a temperature of 29 degrees Celsius at the end of the first time period, which is above the maximum operating temperature. The high-power thermal management mode leads to a temperature of 18 degrees Celsius at the end of the first time period, which is below the minimum operating temperature. The medium-power thermal management mode leads to a temperature of 21 degrees Celsius at the end of the first time period, which lies within the acceptable temperature range for the BESS. Further, the low-power thermal management mode leads to a temperature of 24 degrees Celsius at the end of the first time period, which also lies within the acceptable temperature range for the BESS. The system can remove the two sequences which lead to temperatures outside the allowable range, and keep in the two sequences which lead to allowable temperatures. The system will then use the two allowable sequences at the end of the first time period 302 as a starting point, and determine four more new options for the second time period 304 starting from each of the two allowable sequences at the end of the first time period 302. As shown, the low-power sequence at the end of the first time period 302 is followed by two more allowable sequences at the end of the second time period 304. The two allowable sequences at the end of the second time period 304 include a low-power thermal management mode and a medium-power thermal management mode to choose from. The medium-power sequence at the end of the first time period 302 is followed by two more allowable sequences at the end of the second time period 304. The two allowable sequences at the end of the second time period 304 include a thermal management mode where no active cooling takes place, and a low-power thermal management mode to choose from. The system will continue to identify possible sequences as illustrated in FIG. 3, for each of the remaining time periods in the forecast horizon. The system will also calculate an energy consumption rate for each of the possible sequences identified.

The system can, for the forecast horizon, and based at least in part on the temperature profile, select a sequence of thermal management modes of the plurality of thermal management modes that minimizes an energy consumption rate across the forecast horizon while maintaining the BESS within the operating temperature limitations (170). The system can also, for each of the plurality of time periods and based at least in part on the temperature profile, select a thermal management mode of the plurality of thermal management modes that minimizes an energy consumption rate while maintaining the BESS within the operating temperature limitations. Looking back to FIG. 3, the system can calculate an energy consumption rate for each of the available sequences shown. Using these available sequences, the system can then select the thermal management modes to use in each time period of the plurality of time periods that will result in a selected sequence comprising the lowest energy consumption rate while maintaining the BESS within the operating temperature and sequence limitations.

As an additional example, there may be a scenario where the forecast of external environmental conditions forecasts an outside air temperature at the beginning of a time period that is above a maximum operating temperature of the BESS, but that the outside air temperature will continue to drop until the end of the time period is met. The operating profile of the BESS during this time period may include no charging or discharging schedule, meaning the BESS is not to be operated during this time period. The thermal management modes may include an air conditioning, or liquid cooling, system that can operate in a plurality of operating modes with a plurality of different energy consumption rates. The temperature profile of the BESS in this scenario may show that, while the outside air temperature remains high, the temperature of the BESS will gradually rise towards the maximum operating temperature. But, using the forecast of outside air temperature showing that the outside air temperature will begin to drop consistently over the remainder of the time period, the temperature model may show that the temperature of the BESS may approach the maximum operating temperature, but will be maintained below the maximum operating temperature without the need for activating any thermal management modes. This provides an improvement to prior systems that do not use a forecast of external environmental conditions, where a thermal management mode may still be activated once the BESS starts approaching the maximum operating temperature. Alternatively, the temperature model may show that the BESS may exceed the maximum operating temperature for a time before dropping back below the maximum operating temperature. In this scenario, the system can choose to activate the cooling thermal management mode with the lowest energy consumption rate that ensures the BESS will not exceed the maximum operating temperature. This provides an improvement to prior systems that do not use a forecast of external environmental conditions. For example, a conventional system would activate a thermal management mode as the BESS nears the maximum operating temperature, potentially using a more powerful, and less efficient, cooling mode to lower the temperature of the BESS. The system described herein uses the temperature model and forecast of external environmental conditions to recognize early on that the BESS will exceed its maximum operating temperature at a future time. Thus, the system can activate an efficient cooling mode at an earlier time that consumes less energy than a conventional system.

Figure 9:
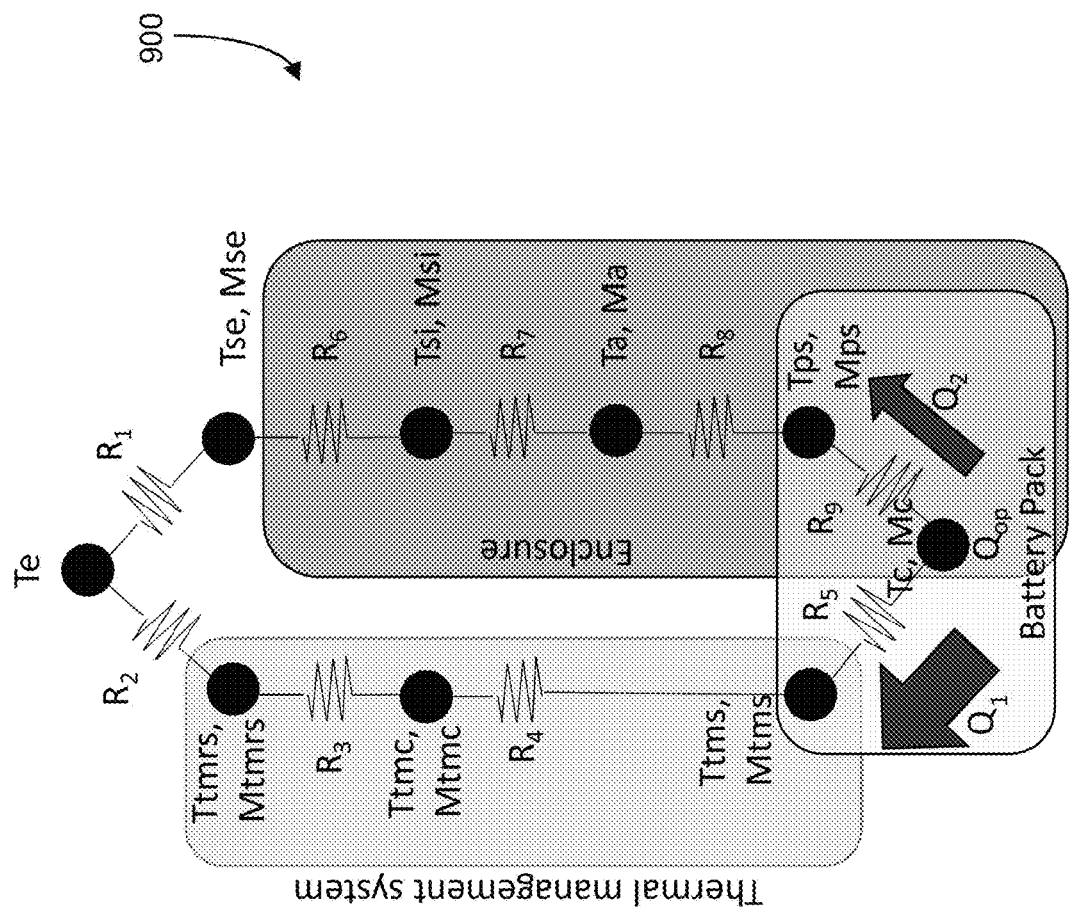
FIG. 9 is an example of a thermal model that can be used to determine the temperature change in a BESS, according to some embodiments.

FIG. 9 is an example of a thermal model 900 that can be used to determine the temperature change in a BESS, according to some embodiments. A data processing system (e.g., a controller, a computer of computer system 401, shown and described with reference to FIG. 4, etc.) may use thermal model 900 to simulate operation of the BESS by calculating the temperature of the BESS during a future time period based on the current or projected temperature of the BESS, an external forecast (e.g., a projected outside air temperature or humidity for different points in time of the future time period), and/or a charging/discharging schedule of the BESS for the future time period. The data processing system may calculate temperature values of the BESS between points in time of time frames of the BESS based on the heat exchange between the different components. The data processing system may do so using different sequences of thermal management modes such that the data processing system may determine times in which the temperature of the BESS will exceed or be less than stored maximum or minimum limitations for the individual sequences of thermal management modes.

The data processing system may execute thermal model 900 according to the following heat transfer algorithm:

$$T(t+\Delta t) = T(t) - Q(t) \times \Delta t / M$$

where T(t) is the temperature at time t, Δt is a time interval, Q(t) is the heat outflow rate at time t, and M is the thermal mass; and $$Q(t) = (T(t) - T_2(t))/R$$

where $T_2(t)$ is the temperature on the other side of R at time t, and R is a heat transfer thermal resistance value. The data processing system may simulate operation of the BESS by executing thermal model 900 for sequential time intervals of a future time period. In doing so, the data processing system may use the predicted temperature from an immediately previous time interval as the value for T(t) to determine the temperature of the BESS at different points in time of the time period.

As illustrated in FIG. 9, Te is the environment temperature (the environmental thermal mass is effectively infinite); Tse and Mse are the enclosure's external surface temperature and corresponding thermal mass; Tsi is the enclosure's internal surface temperature and corresponding thermal mass; Ta is the ambient temperature inside enclosure, and corresponding thermal mass; Tps and Mps are the battery modules' pack surface temperature and corresponding thermal mass; Tc and Mc are the cell temperature and thermal mass; Ttms and Mtms are the thermal management fin surface temperature and corresponding thermal mass; Ttmc and Mtmc are the thermal management coolant temperature and corresponding thermal mass; and Ttmrs and Mtmrs are the thermal management radiator surface temperature and corresponding thermal mass. Additionally, $Q_{op}$ is the heat generated during battery operation; $Q_1$ is the heat removed via thermal management system; $Q_2$ is the natural heat removal from the container walls, where $Q_2$ may be much less than $Q_1$; $R_1$-$R_9$ are heat transfer thermal resistance (HTTR) values; $R_1$ is the HTTR for natural convection around the enclosure environment; $R_2$ is the HTTR for forced convection via thermal management system, where $R_2$ may be much smaller than $R_1$; $R_3$ is the HTTR for heat flow from coolant to radiator surface; $R_4$ is the HTTR for heat flow from fin surface (on battery pack) to coolant; $R_5$ is the HTTR for heat transfer from the cell to the battery pack fin surface; $R_6$ is the HTTR for heat transfer from the inside to the outside surfaces of the enclosure; $R_7$ is the HTTR for heat transfer from ambient temperature to the inside surface of the enclosure; $R_8$ is the HTTR for heat transfer from the battery module/pack surface to ambient; and $R_9$ is the HTTR for heat transfer from the cell to the module/pack surface.

In thermal model 900, the primary drivers may be $Q_{op}$, the heat generated by the battery, which is a function of time and depends on the projected operating conditions of the battery; and $T_e$, the environmental temperature, which is also a function of time (and may be forecast using a weather forecast, for example). The quantities $R_2$ and $R_3$ may depend on the operating mode of the cooling system. $R_2$ can be lowered by turning on fans; and $R_3$ can be lowered by increasing the coolant flow rate (pumps).

Figure 10:
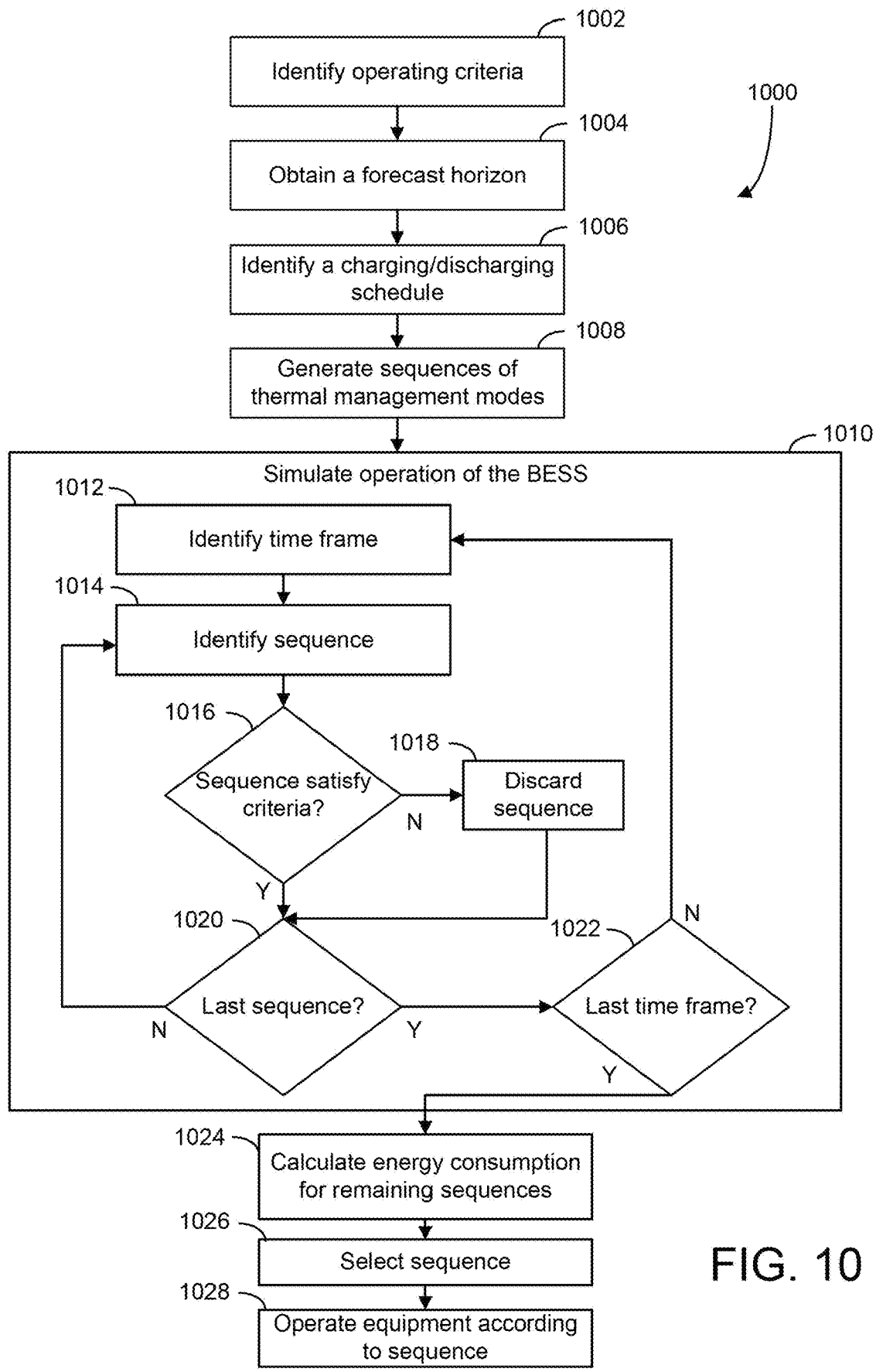
FIG. 10 is a flow chart of a process for managing a temperature of a BESS, according to some embodiments.

FIG. 10 illustrates a method 1000 for managing a temperature of a BESS, according to some embodiments. Method 1000 can be performed by a data processing system (e.g., a controller, a computer of computer system 401, shown and described with reference to FIG. 4, etc.). In some embodiments, the data processing system is the controller of a renewable energy plant that contains one or more renewable energy sources that charge a BESS of the renewable energy plant. The data processing system may control equipment that operates to control the temperature of the BESS of the renewable energy plant as the BESS charges and discharges energy (e.g., charges energy by storing energy received from a renewable energy source and discharging energy to a consumer load, such as a utility grid). Method 1000 may include more or fewer operations and the operations may be performed in any order. Performance of method 1000 may enable the data processing system to operate equipment that controls the temperature of a battery based on a charging/discharging schedule of the battery and/or forecast external environmental conditions. The data processing system may do so in such a way as to ensure the temperature of the BESS follows established criteria while minimizing the amount of energy that is required to do so.

At operation 1002, the data processing system identifies operating criteria for a BESS. The operating criteria may be or include rules for the BESS to operate under and may be stored in memory of the data processing system. Examples of operating criteria include maximum and minimum temperatures for the BESS. Other examples of operating criteria include rules for how equipment that controls the temperature of the BESS (e.g., compressors, heaters, fans, etc.) operate. For example, the operating criteria may include rules that a particular mode of operation (e.g., a set of one or more configurations for one or more pieces of equipment) is required to run for at least a set period of time, if at all; a particular mode may not be allowed to operate after another mode operates; a particular mode may only be allowed to operate following another mode if the other mode has run for at least a set period of time; etc. The data processing system may identify and retrieve such operating criteria from memory to determine which mode to use to control the equipment for a future time period.

At operation 1004, the data processing system obtains a forecast horizon. The forecast horizon may be or include a prediction for a time period as to how much and, in some cases, by what times, renewable energy can be generated for the time period and/or a prediction of external environmental conditions (e.g., outside air temperature, humidity, wind conditions, sunlight, rain forecast, etc.) of the area surrounding the building and/or other storage mechanisms (e.g., devices or containers) in which the BESS is located. In some embodiments, the data processing system obtains the forecast horizon from memory similar to how the data processing system identifies the operating criteria for the BESS. In some embodiments, the data processing system may obtain the forecast from an external system such as a third-party computer that generates weather forecasts. The data processing system may identify the time period and transmit a request to the external system identifying the time period. In response to the request, the data processing system may receive the forecast horizon (or a part of the forecast horizon, such as the weather forecast without an energy generation forecast or vice-versa) from the external system. In this way, the data processing system may obtain a forecast horizon that the data processing system can use to determine the effects that external factors may have on the temperature of the BESS during the time period.

At operation 1006, the data processing system may identify a charging/discharging schedule for the BESS. The data processing system may identify the charging/discharging schedule from memory (e.g., from an operating profile of the BESS that is stored in memory). The charging/discharging schedule may include times in which the BESS will charge (e.g., be charged by renewable energy sources) and/or discharge (e.g., discharge to consumer loads, such as an energy grid, for which the BESS is configured to provide energy). The charging/discharging schedule may indicate specific time frames within the time period (e.g., the time period for the forecast horizon) in which the BESS will charge and/or discharge. In some embodiments, the charging/discharging schedule may include indications of how much energy and, in some cases, for how long, the BESS is predicted to charge or discharge for the different time frames. Because charging and discharging the BESS can both impact the temperature of the BESS, the charging/discharging schedule can be used to predict the temperature of the BESS throughout the time period.

At operation 1008, the data processing system generates sequences of thermal management modes. A thermal management mode may be a set of configurations for equipment that controls the temperature of the BESS. In one example, a thermal management mode may be a "Fans Only" mode in which the only pieces of the equipment that are "on" are the fans. Other examples of thermal management modes include low power modes, high power modes, cooling modes, heating modes, etc., that each include different configurations for the equipment that operates to cool or heat the BESS. In an example embodiment, a sequence of thermal management modes is an order of thermal management modes that the data processing system can use to operate equipment that controls the temperature of the BESS. The sequence of thermal management modes may include modes for separate time frames within the sequence. The data processing system (or another computer) may operate equipment that controls the temperature of the BESS according to the sequence by operating the equipment according to the order and time frames of the modes within the sequence (e.g., the data processing system may operate the equipment according to a first mode during a first time frame, identify a second mode for a subsequent time frame, and operate the equipment according to the second mode during the subsequent time frame). The data processing system may create sequences that can potentially be used to operate the equipment such that the temperature of the BESS remains within the operating criteria, as described below.

To generate the sequences of thermal management modes, the data processing system may retrieve identifications of the different thermal management modes from memory and create multiple vectors with the identifications. The vectors may each be or include a sequence of thermal management modes that indicates an order for the data processing system to operate the equipment that controls the temperature of the BESS. A vector may have a number of index values that is equal to the number of time frames (e.g., pre-defined time frames) within the time period of the forecast horizon. The data processing system may identify the number of time frames within the time period and combine the same number of identifications of modes into a series of vectors with the identifications at each index value of vectors in different orders. When creating the vectors, the data processing system may create a vector such that the vector includes the same mode multiple times or such that the vector does not include a particular mode at all. The data processing system may create the vectors by inserting different permutations of the identifications of the modes in each vector.

At operation 1010, the data processing system simulates operation of the BESS. As will be described in greater detail below, the data processing system may simulate operation of the BESS using different sequences of thermal management modes to predict the temperature of the BESS across the time period. For example, the data processing system may predict the temperature of the BESS across the time period at different points in time using a thermal model (e.g., thermal model 900) and/or according to the equation $$T(t+\Delta t)+T(t)-Q(t)\times\Delta t/M$$

where $T(t)$ is the temperature at time t, $\Delta t$ is a time interval, $Q(t)$ is the heat outflow rate at time t, and M is the thermal mass. The data processing system may determine $Q(t)$ according to the equation $$Q(t)=(T(t)-T_2(t))/R$$

where $T_2(t)$ is the temperature on the other side of R at time t, and R is a heat transfer thermal resistance value. More detail about how the data processing system predicts the temperature for different frames and/or the time period is described herein.

In one example of simulating operation of the BESS, for a sequence of modes, the data processing system may use a stored table with values that represent the impact different variables (e.g., fan on, compressors operating, outside air temperature, charging or discharging, etc.) have on the temperature of the BESS. The data processing system may identify the time at the beginning of a time period or time frame, identify the projected charging or discharging of the BESS during the time period from the charging/discharging schedule, identify the outside air temperature from the forecast horizon, and identify the states of the equipment that operate to control the temperature of the BESS from the respective mode of the sequence and time frame or time period. The data processing system may determine the impact each of the variables have on the temperature from the stored table and calculate the temperature of the BESS for different time points of the time period or time frame by increasing or decreasing the temperature according to the impact values from the stored table. In this way, the data processing system may generate an operating temperature forecast for the BESS across the time frame or time period.

During simulation of operation of the BESS, at operation 1012, the data processing system identifies a time frame. The data processing system may identify the time frame as the first time frame of the time period. For example, the data processing system may divide the time period into multiple time frames of equal or varying duration, depending on how the data processing system is configured. The time frames may be for different non-overlapping or overlapping portions of the time period. In some embodiments, the data processing system may store (e.g., store in memory) a numerical identifier for each time frame that indicates the sequential location of the time frame within the time period as compared to other time frames. In some embodiments, the data processing system may store indications of the times that are included in each time frame. The data processing system may identify the first time frame either based on its numerical identifier, the range of times the time frame includes, the location of the time frame within a database, or using any other technique. In some embodiments, the time frame may correspond to a time frame of an external forecast.

At operation 1014, the data processing system may identify a sequence of thermal management modes. The data processing system may identify the sequence of thermal management modes from memory. The data processing system may identify the sequence of thermal management modes from the sequences that the data processing system created in operation 1008. The data processing system may identify the sequence by searching memory for the location in which the sequences are stored and retrieving the sequence from memory. The data processing system may retrieve any of the sequences of thermal management modes that the data processing system has stored.

At operation 1016, the data processing system may determine if the retrieved sequence of thermal management modes satisfies operating criteria for the battery for the identified time frame. The data processing system may do so by simulating how the equipment that controls the temperature of the BESS will operate under the mode of the sequence that is designated for the first time frame and the effects of such operation on the temperature of the BESS. The data processing system may predict the temperature of the battery at different points in time of the time frame, in some cases including the beginning and end of the time frame, or, in other cases, only the end of the time frame. Individually or together, the predicted temperatures of the battery at different points in time are an operating temperature forecast for the BESS for the sequence of thermal management modes. The data processing system may calculate the temperature at the different points in time of the time period according to a thermal model for the BESS and/or as described herein. The data processing system may identify the predicted temperatures and compare the temperatures against the maximum and/or minimum temperature limits of the operating criteria. If the data processing system determines at least one of the temperatures for the time frame exceeds the maximum temperature limit or is less than the minimum temperature limit, the data processing system may determine the sequence of thermal management modes violates the operating criteria. Otherwise, if none of the temperatures for the time frame exceed the maximum temperature limit or is less than the minimum temperature limit, the data processing system may determine the sequence is still available or eligible to be used to operate the equipment that controls the temperature of the BESS.

In some embodiments, in addition to comparing the temperatures of the time frame to the temperature limits, the data processing system may also determine if operating under the mode of the sequence for the time period would violate any other operating criteria. For example, the data processing system may determine if operating under the mode would violate a rule that indicates that the mode cannot be used for multiple time frames in a row by determining if the sequence includes an identification of the same mode for the previous time frame (if applicable for future iterations of operation 1016 as described below) or an immediately subsequent time frame of the time period. In another example, the data processing system may determine if operating under the mode violates a rule that indicates that the mode can only be used if a particular mode (e.g., the same or a different mode) is the next mode in the sequence. The data processing system can determine if operating under the mode violates any type of criteria. If the data processing system determines operating under the mode violates a particular rule of the criteria, the data processing system may determine the sequence does not satisfy the criteria. Otherwise, the data processing system may determine the sequence is still available or eligible to be used to operate the equipment that controls the temperature of the BESS. In some embodiments, the data processing system may filter sequences of modes using the non-temperature related criteria upon generating or retrieving the sequences of modes and prior to simulating operation of the BESS with the sequences. By doing so, the data processing system may filter out sequences that could not be used for non-temperature related reasons to avoid using processing resources when simulating the operation of the BESS under the filtered sequences.

Responsive to determining the sequence of thermal management modes does not satisfy the operating criteria, at operation 1018, the data processing system discards the sequence or otherwise removes the sequence from consideration as a sequence to use to operate the equipment that controls the temperature of the BESS. The data processing system may do so by setting a flag or setting in memory indicating not to use the sequence for the time period or otherwise removing the sequence from a list of possible sequences (e.g., the data processing system may generate a table or list of possible sequences of thermal management modes and the data processing system may removes the sequence from the table or list). By doing so, the data processing system may avoid processing or simulating operation of the BESS for future or further time frames of the time period, thus increasing processing speed and making the simulation less computationally expensive. Further, setting the flag or setting, the data processing system may avoid selecting a sequence to operate the equipment that would cause the BESS to violate the data processing system's stored operating criteria.

At operation 1020, the data processing system determines if the sequence is the last sequence to use to simulate operation of the BESS. The data processing system may do so by scanning the list of sequences of thermal management modes and determining if there are any sequences for which the data processing system has not simulated operation of the BESS for the time frame (and that has not been removed or discarded in the case in which the sequence is not the first sequence for which the data processing system simulated operation of the BESS). If the search causes the data processing system to identify another sequence for the time frame, the data processing system may repeat operations 1014-1020 until the data processing system determines, at operation 1020, that the data processing system has simulated operation of the BESS for every available and eligible sequence of thermal management modes.

At operation 1022, the data processing system determines if the time frame is the last time frame of the time period. The data processing system may do so by determining if there is another time frame with a higher sequential numerical identifier or that includes later times stored in memory. The data processing system may identify the sequential numerical identifier or times of the time frame and compare the identifier or times to identifiers or times in a database. If there is another time frame with a higher sequential numerical identifier or with later times in the database, at operation 1012, the data processing system may identify the next time frame of the time period and repeat operations 1012-1022. The data processing system may identify the next sequential time frame of the time period in any manner. The data processing system may identify the time frames and perform operations 1012-1022 any number of times until the data processing system has evaluated sequences of thermal management modes for every time frame of the time period.

In some embodiments, when repeating operations 1012-1022 for a sequence for a time frame, the data processing system predicts the temperature of the BESS under the sequence for the time frame and each previous time frame. For example, if the data processing system were simulating operation of the BESS for a sequence of thermal management modes for the fourth time frame of the time period, the data processing system may predict temperatures for each of the first four time frames (e.g., the last temperature of each of the first four time frames or intermittent temperatures of the four time frames). In some embodiments, the data processing system may only predict temperatures for the first four time frames and not further time frames to conserve memory and computer resources. The data processing system may compare the predicted temperatures to the maximum and minimum temperature limits to determine if the sequence would result in the temperature of the BESS getting too high or too low and therefore if the sequence should be removed or discarded as being ineligible. By doing so, the data processing system may be able to accurately predict the temperature of the BESS in the time frame (e.g., the fourth time frame) assuming the data processing system uses the sequence for which the data processing system is simulating operation of the BESS.

Upon evaluating sequences for thermal management modes for every time frame of the time period, at operation 1024, the data processing system calculates the energy consumption for the sequences of thermal management modes that the data processing system did not remove or discard as ineligible during operations 1012-1022. The data processing system may identify the subset of sequences that remain and evaluate how much energy the equipment that controls the temperature of the BESS would use in each sequence according to a stored table or database that indicates the energy usage under each mode (e.g., the data processing system may calculate the amount of energy different pieces of equipment will consume under each sequence based on the activation status of the different equipment during the sequence). The data processing system may avoid calculating the energy consumption for sequences that have been removed or discarded to both save processing resources and to avoid using a sequence of thermal management modes that would violate the operating criteria to control the equipment that controls the temperature of the BESS.

At operation 1026, based on the calculations at operation 1024, the data processing system selects the sequence that will utilize the least amount of energy across the time period and that will not satisfy the operating criteria of the BESS. The data processing system may identify the energy consumption values that the data processing system calculated for each of the available sequences and compare the values with each other. Based on the comparison, the data processing system may identify the sequence that will utilize the least amount of energy and that will satisfy the operating criteria.

At operation 1028, the data processing system operates the equipment according to the selected equipment. The data processing system may operate the equipment over the time period. The data processing system may operate the equipment by changing the modes of operation of the equipment that controls the temperature of the BESS according to the identifications of the modes in the vector of the sequence. The data processing system may change the states of the equipment in different time frames of the time period according to the vector. Thus, the data processing system may minimize the amount of energy the BESS will use when charging and discharging over the time period while taking into account external factors such as outside air temperature.

In some embodiments, the data processing system may perform operations 1002-1028 at least once during one or more time frames of the time period. For example, during the initial (or another) time frame of the time period, the data processing system may simulate operation of the BESS using the sequence of thermal management modes the data processing system selected during performance of operations 1002-1028. In some embodiments, the data processing system may do so in response to receiving or otherwise obtaining a new forecast of external environmental conditions or a new charging/discharging schedule. In performing the simulations, the data processing system may use the current temperature or the temperature at the end of the time frame as the initial temperature (in which case the data processing system may perform the simulations between time frames) and determine the temperature for the remaining time period under the sequence. If the data processing system detects that the operation of the equipment that controls the temperature of the BESS under the sequence will cause the BESS to violate the operating temperature limitations, the data processing system may perform operations 1002-1028 for the remaining time period to identify a sequence of thermal management modes that will enable the BESS to stay within the operating temperature limitations (and/or any other criteria) while minimizing the amount of energy that is required to do so.

Computer Systems

Figure 4:
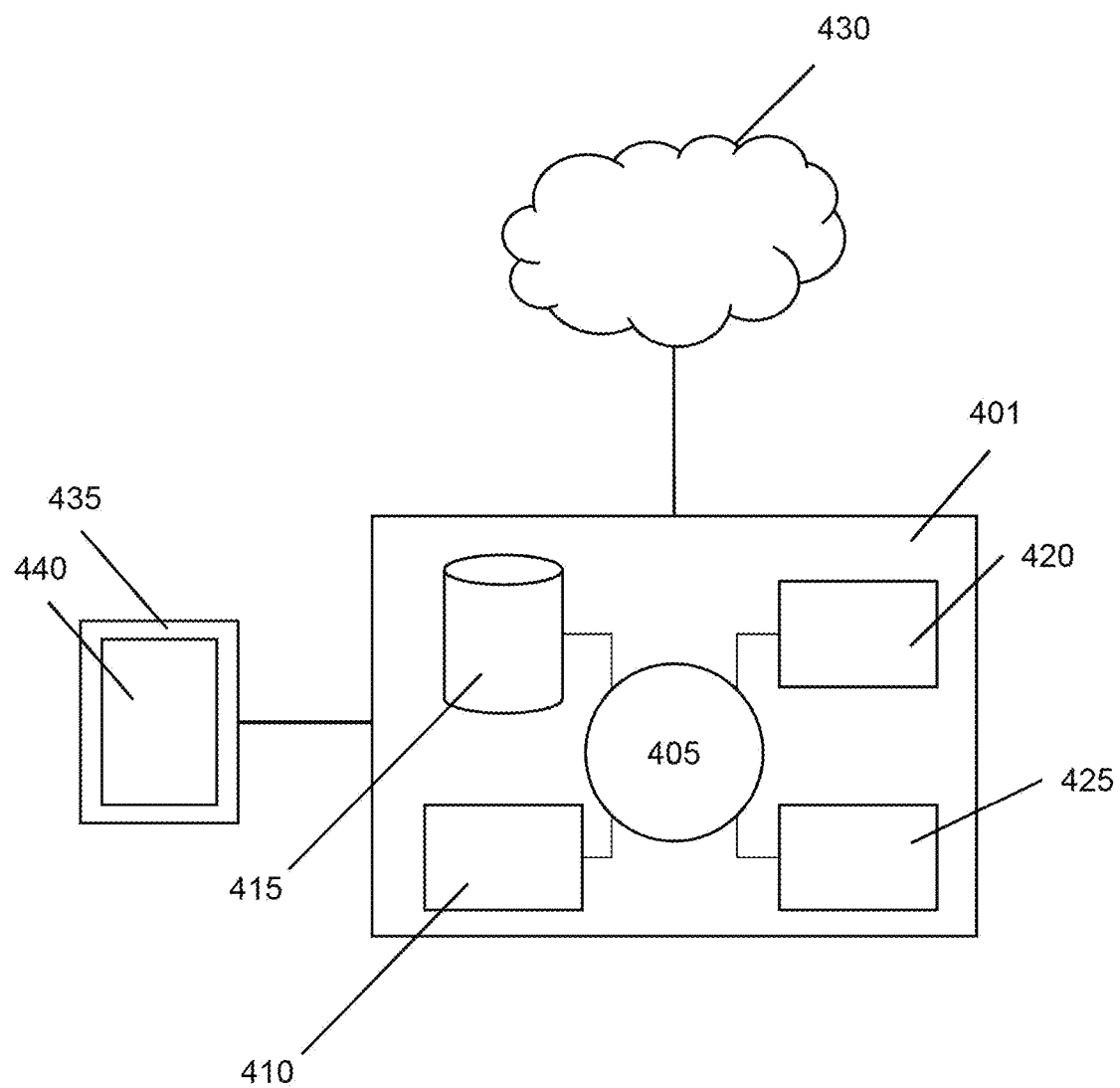
FIG. 4 shows a computer system that is programmed or otherwise configured to implement methods provided herein, according to some embodiments.

The present disclosure provides computer systems that are programmed to implement methods of the disclosure. FIG. 4 shows a computer system 401 that is programmed or otherwise configured to implement the process 100 of FIGS. 1 and/or 1000 of FIG. 10. The computer system 401 can be an electronic device of a user or a computer system that is remotely located with respect to the electronic device. The electronic device can be a mobile electronic device.

The computer system 401 includes a central processing unit (CPU, also "processor" and "computer processor" herein) 405, which can be a single core or multi core processor, or a plurality of processors for parallel processing. The computer system 401 also includes memory or memory location 410 (e.g., random-access memory, read-only memory, flash memory), electronic storage unit 415 (e.g., hard disk), communication interface 420 (e.g., network adapter) for communicating with one or more other systems, and peripheral devices 425, such as cache, other memory, data storage and/or electronic display adapters. The memory 410, storage unit 415, interface 420 and peripheral devices 425 are in communication with the CPU 405 through a communication bus (solid lines), such as a motherboard. The storage unit 415 can be a data storage unit (or data repository) for storing data. The computer system 401 can be operatively coupled to a computer network ("network") 430 with the aid of the communication interface 420. The network 430 can be the Internet, an internet and/or extranet, or an intranet and/or extranet that is in communication with the Internet. The network 430 in some cases is a telecommunication and/or data network. The network 430 can include one or more computer servers, which can enable distributed computing, such as cloud computing. The network 430, in some cases with the aid of the computer system 401, can implement a peer-to-peer network, which may enable devices coupled to the computer system 401 to behave as a client or a server.

The CPU 405 can execute a sequence of machine-readable instructions, which can be embodied in a program or software. The instructions may be stored in a memory location, such as the memory 410. The instructions can be directed to the CPU 405, which can subsequently program or otherwise configure the CPU 405 to implement methods of the present disclosure. Examples of operations performed by the CPU 405 can include fetch, decode, execute, and writeback.

The CPU 405 can be part of a circuit, such as an integrated circuit. One or more other components of the system 401 can be included in the circuit. In some cases, the circuit is an application specific integrated circuit (ASIC).

The storage unit 415 can store files, such as drivers, libraries and saved programs. The storage unit 415 can store user data, e.g., user preferences and user programs. The computer system 401 in some cases can include one or more additional data storage units that are external to the computer system 401, such as located on a remote server that is in communication with the computer system 401 through an intranet or the Internet.

The computer system 401 can communicate with one or more remote computer systems through the network 430. For instance, the computer system 401 can communicate with a remote computer system of a user (e.g., e.g., a database, an enterprise or extraprise system, an Internet-of-Things (IoT) device, a sensor, or the like). Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 401 via the network 430.

Methods as described herein can be implemented by way of machine (e.g., computer processor) executable code stored on an electronic storage location of the computer system 401, such as, for example, on the memory 410 or electronic storage unit 415. The machine executable or machine readable code can be provided in the form of software. During use, the code can be executed by the processor 405. In some cases, the code can be retrieved from the storage unit 415 and stored on the memory 410 for ready access by the processor 405. In some situations, the electronic storage unit 415 can be precluded, and machine-executable instructions are stored on memory 410.

The code can be pre-compiled and configured for use with a machine having a processer adapted to execute the code, or can be compiled during runtime. The code can be supplied in a programming language that can be selected to enable the code to execute in a pre-compiled or as-compiled fashion.

Aspects of the systems and methods provided herein, such as the computer system 401, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 401 can include or be in communication with an electronic display 435 that comprises a user interface (UI) 440 for providing, for example, a graphical representation of the BESS as described herein. Examples of UI's include, without limitation, a graphical user interface (GUI) and web-based user interface.

Methods and systems of the present disclosure can be implemented by way of one or more algorithms. An algorithm can be implemented by way of software upon execution by the central processing unit 405. The algorithm can, for example, determine a thermal model for a BESS, determine a temperature profile for a BESS, and identify the most energy efficient thermal management mode sequences for keeping the BESS within a defined allowable temperature range.

EXAMPLES

Figure 5:
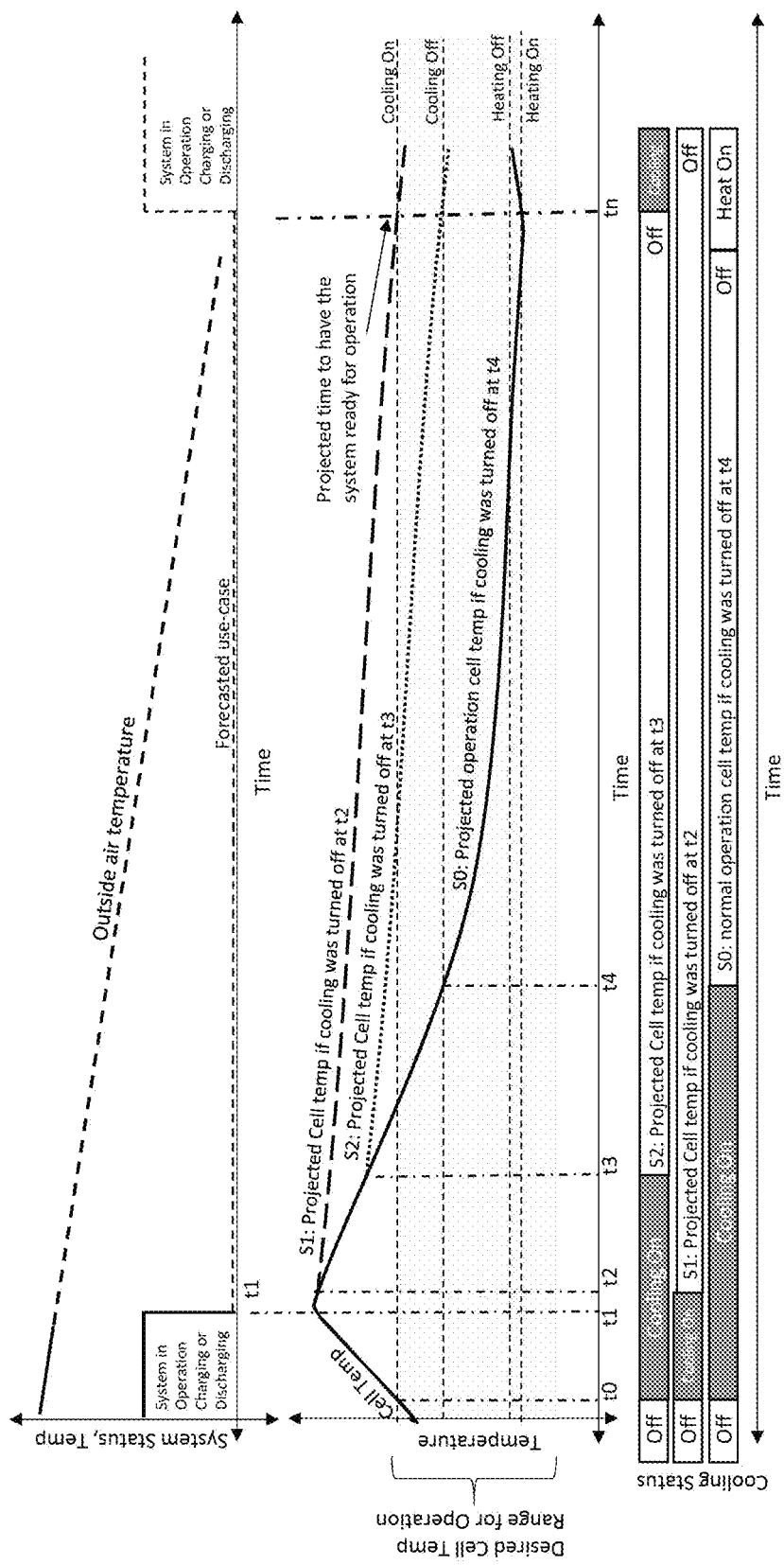
FIG. 5 is a graph illustrating multiple thermal management modes for managing the temperature of a BESS, according to some embodiments.

Example 1: Thermal Management of a BESS Using a Forecast of External Environmental Conditions and a BESS Operating Profile In one example, the method of FIG. 1 may be used to manage the temperature of a BESS using a forecast of external environmental conditions and a BESS operating profile. As illustrated in FIG. 5, before $t_0$ the battery is operating, and the temperature is rising. At time $t_0$ the temperature exceeds the cooling operating limit and the system starts actively cooling the cells.

In conventional systems, the thermal management system would then continue to operate until reaching a lower, "cooling off" threshold is reached at the time marked $t_4$, when it would shut off. In FIG. 5, the outside air temperature is shown as declining throughout. If, by time $t_4$, the outside air temperature had fallen below the "cooling off" threshold temperature, the battery temperature would continue to decline after the thermal management system had stopped actively cooling the battery. The battery temperature would continue to decline until it reached a point, shortly before $t_n$, where the thermal management system would begin to heat the battery cells. However, knowing that the outside air temperature is trending downward, and that the battery is forecast to remain idle until time $t_n$, an improved approach is possible. It would be possible to shut off the cooling system at an earlier time, thus saving cooling and heating energy, and still have the battery temperature reach a desired range by $t_n$. Examples of possibly earlier shutdown times are marked $t_2$ and $t_3$. If the cooling were shut down at $t_2$, the battery temperature would decline to the upper end of the acceptable range by $t_n$; if it were shut down at $t_3$, the battery temperature would decline to the "cooling off" threshold by $t_n$. In either case, by time to the battery temperature would be within an acceptable range and the energy used for thermal management would be lower than in the conventional approach.

Figure 6:
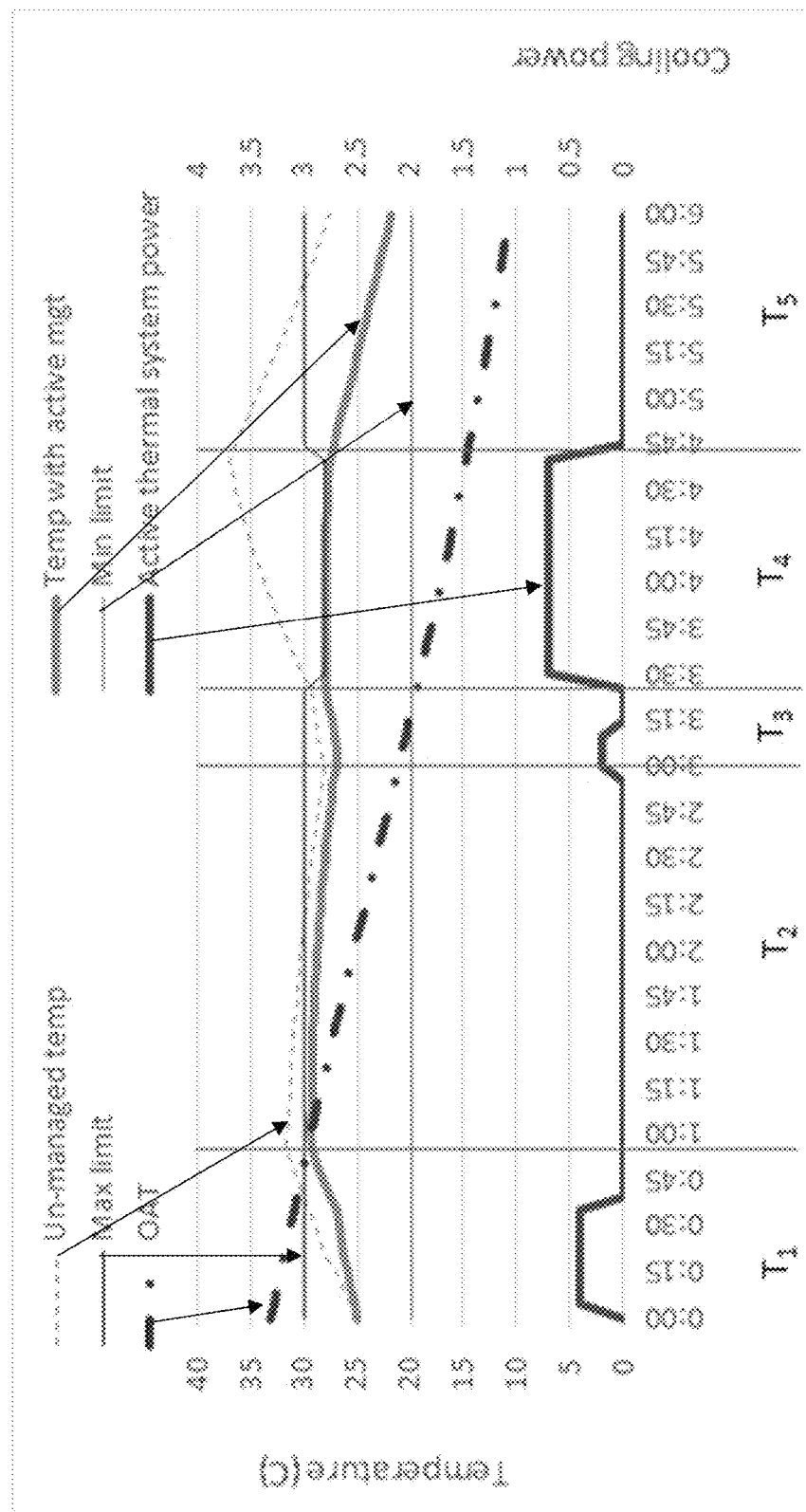
FIG. 6 is a graph illustrating multiple thermal management modes for managing the temperature of a BESS, according to some embodiments.

Example 2: Thermal Management of a BESS Using a Forecast of External Environmental Conditions and a BESS Operating Profile In an additional example, the method of FIG. 1 may be used to manage the temperature of a BESS using a forecast of external environment conditions and a BESS operating profile. FIG. 6 illustrates how thermal management modes may be operated in an improved manner, taking outside air temperature into consideration.

In FIG. 6, during the period marked $T_1$, the electrical operation of the battery is in a limited ("degraded") range, which allows its temperature to have a wide operating range. In the example, the maximum operating temperature limit is set to 30 degrees Celsius. The first time interval considered, shown as $T_1$, comes to an end at a local peak in the forecast "free" battery temperature (un-managed temp line), when the electrical operation of the battery would stop, allowing the battery to start cooling. The un-managed temp line shows that the battery temperature would have exceeded the 30 degrees Celsius limit by that time, without active cooling.

Using the systems and methods described herein, a cooling mode would therefore be selected, and the mode selected would be the most efficient one capable of bringing the temperature within the operating temperature limits at the end of $T_1$. As shown, this cooling mode is shown as being powerful enough to reduce the rate of temperature increase by more than is necessary to keep the temperature inside the allowed temperature range at the end of $T_1$. Therefore, the cooling mode can be run for only part of the duration of $T_1$ and can be shut off at a time that will allow the battery temperature to approach—but not reach—the maximum allowed temperature at the end of $T_1$. By selecting the most efficient mode that can assure acceptable temperature limits, and by shutting off the active cooling early, the system reduces the cooling energy used.

During the time interval marked $T_2$, the battery is not operating and its temperature will naturally tend to drift toward the environmental temperature (the outside air temperature, or "OAT," is shown on the graph as the dash-dot line). Since, starting near the maximum allowed temperature at the end of $T_1$, the battery would naturally remain within the allowed temperature range throughout $T_2$, no active thermal management need be used during $T_2$.

During the time interval marked $T_3$, the battery is operating at a low power level, which would cause the temperature to rise, but not by enough to exceed the maximum temperature limit. However, $T_3$ ends when the battery power increases beyond the limits of "degraded" operation, which introduces an upper normal temperature limit to be defined by the normal operating temperature range (and, thus, to move below the maximum operating temperature, as shown). If the battery temperature were allowed to rise naturally, at the end of $T_3$ the temperature would be above the top of the normal operating temperature range. In preparation for the switch to the normal operating temperature limits at the start of $T_4$, the battery will need to be within that smaller range by the end of $T_3$. A highly-efficient but low-powered active cooling method, run for just part of the duration of $T_3$, is shown as being sufficient to achieve this.

During $T_4$ the battery starts at the top of the allowed (now, the normal) temperature range. To keep the temperature within the allowed range, the system needs to use a relatively high-power cooling mode. Again, the most efficient cooling mode capable of meeting the requirement is chosen. Period $T_4$ ends when the operation of the battery switches to "off" so that the upper allowed temperature limit would rise to the "derated" limit. At the same time, the battery temperature would naturally begin to decline.

Time interval $T_5$ begins at the end of $T_4$ and extends to the end of the forecast horizon. The switch from high-power operation to "off" causes the allowed temperature range to expand to the "derated" range. Since the battery temperature was being held within the "normal" range, it is naturally within the derated range, and the active cooling can be shut off, allowing the battery temperature to drift down within the allowed temperature range.

If $T_5$ were longer, with the OAT as low as it is, the battery temperature might drift below the lower edge of the allowed operating temperature range. In that case, a low-power heating mode might be applied during part of $T_5$, to warm the battery and keep it from becoming too cold.

Example 3: Thermal Management of a BESS Using a Forecast of External Environmental Conditions and a BESS Operating Profile In an additional example, the method of FIG. 1 may be used to manage the temperature of a BESS using a forecast of external environment conditions and a BESS operating profile. In this example, the OAT is assumed constant at 15 degrees Celsius and the BESS is not currently operating. The BESS is forecast to begin operation again in 3 hours. The requirement is that the battery temperature should be as close as possible to 23 degrees Celsius in preparation for resuming operation.

In this example, the cooling system is equipped with two compressors, a fan, and one heating unit. Every 20 minutes, each compressor is capable of removing enough heat to lower cell temperature by 2 degrees Celsius; thus, if both compressors are operating together, they can lower cell temperature by 4 degrees Celsius every 20 minutes. While the rate of heat removal would ordinarily depend on outside air temperature, it is assumed here that OAT is constant at 15 degrees Celsius. If operated alone (i.e., without the compressors), with an OAT of 15 degrees Celsius it is assumed the fan would be capable of reducing the temperature of the cells by approximately 1 degree Celsius every 20 minutes. If no thermal management system is operated, the battery cell temperature will fall by 7% of the difference between the battery cell temperature and the OAT, assuming the OAT is lower.

As shown in FIGS. 7A and 7B, the battery cell temperature is initially 34 degrees Celsius. Using a conventional thermal management approach, the thermal management system would operate both compressors and the fan to bring the battery cell temperatures down by 4 degrees Celsius every 20 minutes. Over the course of 1 hour the battery temperature would be brought down to 22 degrees Celsius, at which point the cooling system would be shut off. Total energy used by the thermal management system would be 19.3 kWh, as shown in FIG. 7B.

However, using an advanced thermal management system, as described herein, knowing that the OAT is forecast to remain at 15 degrees Celsius and knowing that the battery will not be operated again until the 3-hour mark, the initial cooling can use just a single compressor for 40 minutes, and run the fan for another 1 hour and 40 minutes, then shut off all active thermal management and allow natural cooling to bring the temperature down to 23 degrees Celsius by the 3-hour point. Total energy used in this approach is 9.3 kWh, as shown in FIG. 7B, approximately half of that used by the conventional approach.

Example 4: Thermal Management of a BESS Using a Forecast of External Environmental Conditions and a BESS Operating Profile In an additional example, the method of FIG. 1 may be used to manage the temperature of a BESS using a forecast of external environment conditions and a BESS operating profile. In this example, the OAT is assumed constant at 15 degrees Celsius and the BESS is not currently operating. The BESS is forecast to begin operation again in 1 hour. The requirement is that the battery temperature should be as close as possible to 23 degrees Celsius in preparation for resuming operation.

In this example, the cooling system is equipped with two compressors, a fan, and one heating unit. Every 20 minutes, each compressor is capable of removing enough heat to lower cell temperature by 2 degrees Celsius; thus, if both compressors are operating together, they can lower cell temperature by 4 degrees Celsius every 20 minutes. While the rate of heat removal would ordinarily depend on outside air temperature, it is assumed here that OAT is constant at 15 degrees Celsius. If operated alone (i.e., without the compressors), with an OAT of 15 degrees Celsius it is assumed the fan would be capable of reducing the temperature of the cells by approximately 1 degree Celsius every 20 minutes. If no thermal management system is operated, the battery cell temperature will fall by 7% of the difference between the battery cell temperature and the OAT, assuming the OAT is lower.

As shown in FIGS. 8A and 8B, the temperature is required to be as close as possible to 23 degrees Celsius, with the battery cell temperature initially being 34 degrees Celsius, and 1 hour until the batteries are to be operated again. Using a conventional thermal management approach, the thermal management system would operate both compressors and the fan to bring the battery cell temperatures down by 4 degrees Celsius every 20 minutes. Over the course of 1 hour the battery temperature would be brought down to 22 degrees Celsius, at which point the cooling system would be shut off. Total energy used by the thermal management system would be 16.7 kWh, as shown in FIG. 8B.

Using an advanced thermal management approach, as described herein, knowing that the OAT is forecast to remain at 15 degrees Celsius and knowing that the battery will not be operated again until the 1-hour mark, the initial cooling can stop one of the compressors after 40 minutes, taking advantage of the available time to bring the battery cell temperature to exactly 23 degrees Celsius by the 1-hour point. Total energy used in this approach is 14.3 kWh, as shown in FIG. 8B, a 14% reduction in thermal management energy use relative to the conventional approach.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for managing a temperature of a battery energy storage system ("BESS"), comprising:
    identifying, by a processor, operating temperature limitations of the BESS;
    obtaining, by the processor, a forecast horizon comprising a forecast of external environmental conditions for a time period;
    identifying, by the processor, a charging/discharging schedule of the BESS for the time period;
    selecting, by the processor, a sequence of thermal management modes of a plurality of sequences responsive to the sequence minimizing an energy consumption of equipment configured to operate to affect a temperature of the BESS across the time period and causing the BESS to remain within the operating temperature limitations, wherein each thermal management mode of the sequence of the plurality of sequences corresponds to an equipment configuration of the equipment; and
    operating, by the processor, the equipment according to the selected sequence of thermal management modes.

2. The method of claim 1, further comprising removing, by the processor, a subset of sequences from the plurality of sequences responsive to the BESS having an operating temperature that exceeds a maximum temperature limitation or a minimum temperature limitation for at least one point in time of the time period.

3. The method of claim 2, further comprising:
    except for the subset of sequences, comparing, by the processor, the generated energy consumption across the time period for the plurality of sequences between each other,
        wherein selecting the sequence of the thermal management modes is performed based on the comparison.

4. The method of claim 1, further comprising:
identifying, by the processor, a plurality of thermal management modes from memory, and
combining, by the processor, different subsets of the plurality of thermal management modes into the plurality of sequences of thermal management modes.

5. The method of claim 1, wherein a first sequence of the plurality of sequences of thermal management modes comprises an activation status of one or more compressors, a heater, and/or a fan for each of a plurality of time frames within the time period.

6. The method of claim 5, further comprising calculating, by the processor, a first energy consumption of the one or more compressors, the heater, and/or the fan for the time period based on the activation status of the one or more compressors, the heater, and/or the fan for the plurality of time frames.

7. The method of claim 1, wherein the time period comprises a plurality of time frames, and further comprising:
identifying, by the processor, a first operating temperature of the BESS under a first sequence of thermal management modes within a first time frame of the plurality of time frames;
determining, by the processor, the first operating temperature of the BESS exceeds a maximum operating temperature limit or is less than a minimum operating temperature limit; and
responsive to the determining, removing, by the processor, the first sequence of thermal management modes from the plurality of sequences of thermal management modes.

8. The method of claim 7, further comprising:
subsequent to removing the first sequence of thermal management modes from the plurality of sequences of thermal management modes, for a second time frame subsequent to the first time frame, comparing, by the processor, a second operating temperature of the BESS under each of the plurality of sequences except for the first sequence of thermal management modes to the maximum operating temperature limit or the minimum operating temperature limit.

9. The method of claim 7, wherein identifying the first operating temperature for the BESS comprises identifying, by the processor, the first operating temperature of the BESS at an end of the first time frame.

10. The method of claim 1, further comprising:
upon identifying a subset of sequences of the plurality of sequences that do not violate any operating criteria of the BESS, comparing, by the processor, an energy consumption across the time period of each sequence of the subset,
wherein selecting the sequence of thermal management modes comprises selecting, by the processor, the sequence of thermal management modes from the subset responsive to the sequence of thermal management modes having a lowest energy consumption of the subset.

11. A system for managing a temperature of a battery energy storage system ("BESS"), comprising:
one or more computer processors operatively coupled to computer memory and configured by machine-readable instructions to:
identify operating temperature limitations of the BESS;
obtain a forecast horizon comprising a forecast of external environmental conditions for a time period;
identify a charging/discharging schedule of the BESS for the time period;
select the sequence of thermal management modes of the plurality of sequences responsive to the sequence minimizing an energy consumption of equipment configured to operate to affect a temperature of the BESS across the time period and causing the BESS to remain within the operating temperature limitations, wherein each thermal management mode of a sequence of the plurality of sequences corresponds to an equipment configuration of the equipment; and
operate the equipment according to the selected sequence of thermal management modes.

12. The system of claim 11, wherein the one or more computer processors are further configured to remove a subset of sequences from the plurality of sequences responsive to the BESS having an operating temperature that exceeds a maximum temperature limitation or a minimum temperature limitation for at least one point in time of the time period.

13. The system of claim 11, wherein the one or more computer processors are further configured by the machine-readable instructions to, except for the subset of sequences, compare the generated energy consumption across the time period for the plurality of sequences between each other.

14. The system of claim 11, wherein the one or more computer processors are further configured by the machine-readable instructions to:
identify a plurality of thermal management modes from memory, and
combine different subsets of the plurality of thermal management modes into the plurality of sequences of thermal management modes.

15. The system of claim 11, wherein a first sequence of the plurality of sequences of thermal management modes comprises an activation status of one or more compressors, a heater, and/or a fan for each of a plurality of time frames within the time period.

16. The system of claim 15, wherein the one or more computer processors are further configured to calculate a first energy consumption of the one or more compressors, the heater, and/or the fan for the time period based on the activation status of the one or more compressors, the heater, and/or the fan for the plurality of time frames.

17. The system of claim 11, wherein the time period comprises a plurality of time frames, and wherein the one or more computer processors are further configured to:
identify a first operating temperature of the BESS under a first sequence of thermal management modes within a first time frame of the plurality of time frames;
determine the first operating temperature of the BESS exceeds a maximum operating temperature limit or is less than a minimum operating temperature limit; and
responsive to the determining, remove the first sequence of thermal management modes from the plurality of sequences of thermal management modes.

18. One or more non-transitory computer storage media storing instructions that are operable, when executed by one or more computers, to cause said one or more computers to perform operations comprising:
identifying operating temperature limitations of a battery energy storage system ("BESS");
obtaining a forecast horizon comprising a forecast of external environmental conditions for a time period;
identifying a charging/discharging schedule of the BESS for the time period;

selecting the sequence of thermal management modes of the plurality of sequences responsive to the sequence minimizing an energy consumption of equipment configured to operate to affect a temperature of the BESS across the time period and causing the BESS to remain within the operating temperature limitations, wherein each thermal management mode of a sequence of the plurality of sequences corresponds to an equipment configuration of the equipment; and operating the equipment according to the selected sequence of thermal management modes.

19. The non-transitory computer storage media of claim 18, further comprising removing a subset of sequences from the plurality of sequences responsive to the BESS having an operating temperature that exceeds a maximum temperature limitation or a minimum temperature limitation for at least one point in time of the time period.

20. The non-transitory computer storage media of claim 18, further comprising identifying a plurality of thermal management modes from memory, and combining different subsets of the plurality of thermal management modes into the plurality of sequences of thermal management modes.

* * * * *